United States Patent [19]
Kimura et al.

[11] Patent Number: 6,072,240
[45] Date of Patent: Jun. 6, 2000

[54] SEMICONDUCTOR CHIP PACKAGE

[75] Inventors: Tomonori Kimura, Kariya; Norihito Tokura; Fumio Ohara, both of Okazaki; Masahito Mizukoshi, Nagoya, all of Japan

[73] Assignee: Denso Corporation, Kariya, Japan

[21] Appl. No.: 09/174,171

[22] Filed: Oct. 16, 1998

[51] Int. Cl.[7] .......................... H01L 23/48; H01L 23/52; H01L 29/40
[52] U.S. Cl. .......................... 257/735; 257/705; 257/736; 257/692; 257/758
[58] Field of Search .................................. 257/705, 735, 257/736, 692, 779, 758, 107

[56] References Cited

U.S. PATENT DOCUMENTS

| | | | |
|---|---|---|---|
| 4,141,030 | 2/1979 | Eisele et al. | |
| 4,538,170 | 8/1985 | Yerman | 257/705 |
| 4,646,129 | 2/1987 | Yerman et al. | 257/717 |
| 4,827,082 | 5/1989 | Horiuchi et al. | 257/705 |
| 5,708,299 | 1/1998 | Teramae et al. | |

FOREIGN PATENT DOCUMENTS

| | | |
|---|---|---|
| 54-040569 | 3/1979 | Japan . |
| 54-095183 | 7/1979 | Japan . |
| 59-31042 | 2/1984 | Japan . |
| 59-38734 | 9/1984 | Japan . |
| 61-251043 | 11/1986 | Japan . |
| 62-287649 | 12/1987 | Japan . |
| 1-228138 | 9/1989 | Japan . |
| 3-20067 | 1/1991 | Japan . |
| 4-249353 | 9/1992 | Japan . |
| 6-291223 | 10/1994 | Japan . |
| 7-38013 | 2/1995 | Japan . |
| 7-273276 | 10/1995 | Japan . |
| 8-330338 | 12/1996 | Japan . |
| 10-56131 | 2/1998 | Japan . |

*Primary Examiner*—Sheila V. Clark
*Attorney, Agent, or Firm*—Pillsbury Madison & Sutro, LLP

[57] ABSTRACT

A semiconductor device which improves heat radiation performance and realizes size reduction and enables heat to be radiated swiftly from both of the principal surfaces of a semiconductor chip even when the semiconductor chip has a construction vulnerable to stresses. It comprises several IGBT chips each having a collector electrode on one principal surface and an emitter electrode and a gate electrode on the other principal surface and two high thermal conductivity insulating substrates sandwiching these IGBT chips and having electrode patterns for bonding to the electrodes of the IGBT chips disposed on their sandwiching surfaces, the electrodes of the IGBT chips and the electrode patterns of the high thermal conductivity insulating substrates being bonded by brazing.

29 Claims, 16 Drawing Sheets

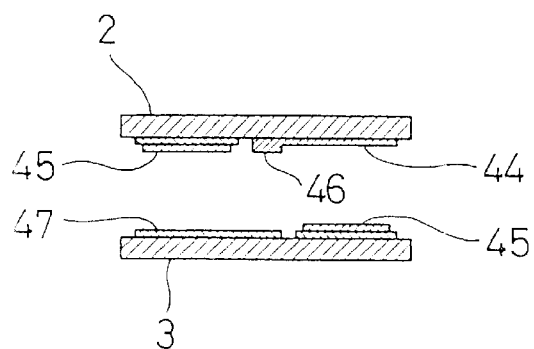
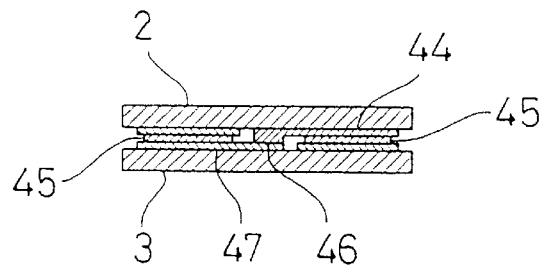
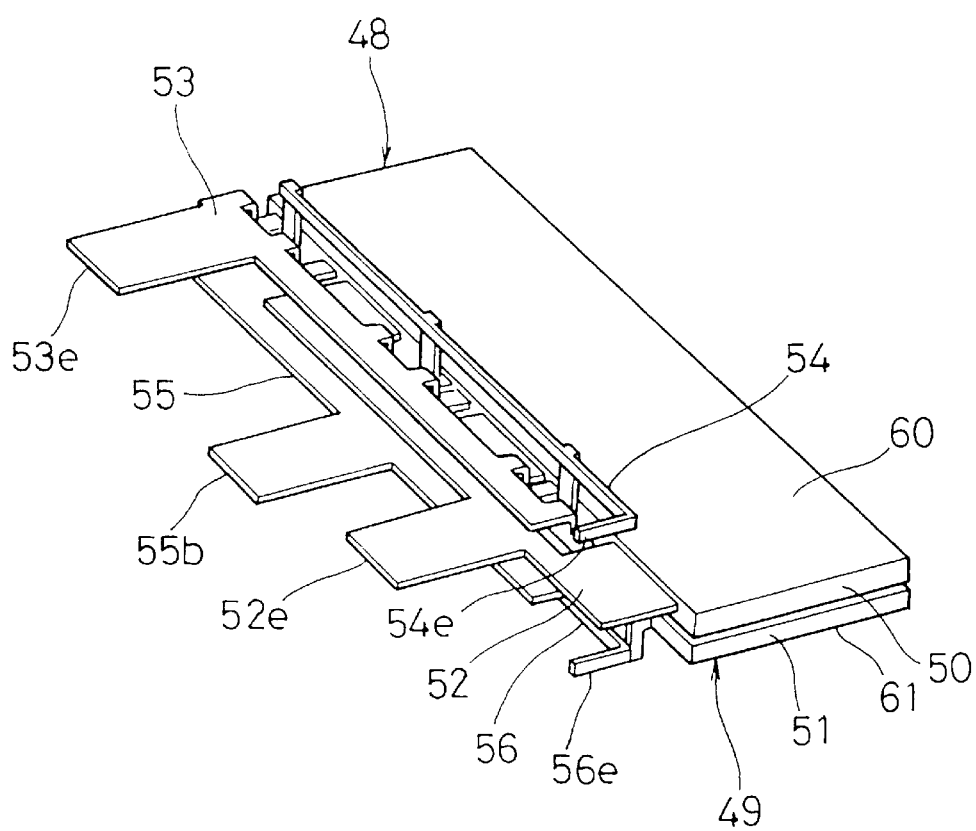

SEMICONDUCTOR CHIP PACKAGE

CROSS REFERENCE TO RELATED APPLICATION

This application is based upon Japanese Patent Application No. Hei 8-212325 (JP-A-10-56131), filed Aug. 12, 1996, the entire contents of which are incorporated herein by reference.

BACKGROUND OF THE INVENTION

1. Field of the Invention

This invention relates to a semiconductor device comprising one or more semiconductor chips such as for example power MOSFETs and IGBTs built into a package.

2. Description of Related Art

Because semiconductor chips such as power MOSFETs and IGBTs are devices for controlling large currents, they produce large amounts of heat. Consequently, when these semiconductor chips are built into packages, it is arranged to achieve a sufficient cooling (heat radiation). For example, in the case of an IGBT module consisting of a plurality of IGBT chips built into a package, an insulating substrate made of a high thermal conductivity ceramic is used, and the plurality of IGBT chips are mounted on this insulating substrate, and main electrodes provided on the lower surfaces (lower principal surfaces) of the IGBT chips are connected by soft soldering to a copper thick film provided on the insulating substrate.

Main electrodes and control electrodes provided on the upper surfaces (upper principal surfaces) of the IGBT chips are connected to a copper thick film provided on the insulating substrate by wire bonding. The insulating substrate is soldered to a heat radiation plate made of copper. By this means, heat produced by the IGBT chips is transmitted through the insulating substrate to the heat radiation plate and radiated away. This kind of IGBT module is used in invertor main circuits of invertors in a class of several tens to several hundreds of Amperes.

In the case of an IGBT module of the related art construction described above, heat produced by the IGBT chips is radiated through the insulating substrate disposed on the lower surface side of the IGBT chips; that is, heat is radiated mainly from the lower surface of the IGBT chip. With this construction, because heat is only radiated from one surface of each of the IGBT chips, there is a limit to how much the heat-radiation performance can be raised, and reducing the size of the construction of the IGBT module as a whole has also been difficult.

When on the other hand the IGBT module is constructed so that heat is radiated from both the upper surface and the lower surface (the two principal surfaces) of the semiconductor chips, the heat-radiation performance can be increased greatly. One example of this construction is a thyristor package. This package has a structure wherein a thyristor chip is sandwiched by two electrode blocks serving both as electrodes and as heat sinks (radiator). With this construction, heat produced by the thyristor chip is transmitted from both the upper surface and the lower surface of the chip to the electrode blocks. In the case of a thyristor, to obtain electrical connection between the electrodes of the thyristor chip and the electrode blocks, the thyristor chip sandwiched by the electrode blocks is pressed with a considerably large force.

However, semiconductor chips like IGBT chips having MOS gate structures have the characteristic that they are vulnerable to stresses. Consequently, it is not possible to employ the method of pressing the semiconductor chips with electrode blocks. To overcome this, as a construction wherein semiconductor chips are sandwiched between two high thermal conductivity insulating substrates without being pressed, there is the construction disclosed in Japanese Patent Application Laid-Open No. S.59-31042. In this case of this Japanese Patent Application Laid-Open No. S.59-31042, because the lower side of the semiconductor chip is fixed to an electrode provided on an insulating substrate, heat produced by the semiconductor chip is radiated from this lower side of the chip smoothly.

However, on the upper side of the semiconductor chip, because the electrodes on this upper side and electrodes provided on the upper insulating substrate are connected by bonding pads and metal bumps, the area of the connection is small. Consequently, there has been the problem that the electrical resistance is large, which is disadvantageous to obtaining large currents, and that heat produced by the semiconductor chip is not readily transmitted to the insulating substrate, and thus the heat-radiation performance is poor.

SUMMARY OF THE INVENTION

The present invention is made in light of the foregoing problems, and it is an object of the present invention to provide a semiconductor device which improves heat radiation performance; which can be reduced in size; and with which heat can be radiated swiftly from two principal surfaces of a semiconductor chip even if the semiconductor chip has a construction such that it is vulnerable to stresses.

According to a semiconductor device of the present invention, a semiconductor chip is sandwiched between two high thermal conductivity insulating substrates, and the electrodes of the semiconductor chip and electrode patterns on the high thermal conductivity insulating substrates are bonded by brazing. Consequently, heat produced by the semiconductor chip is smoothly transmitted from the two principal surfaces of the semiconductor chip to the two high thermal conductivity insulating substrates, and is thereby radiated quickly. As a result, it is possible to reduce the size of the semiconductor device. Also, because the electrodes of the semiconductor chip and the electrode patterns on the high thermal conductivity insulating substrates are bonded by brazing, the semiconductor chip is not required to be pressed, and furthermore, the bonding area (connection area) becomes larger to decrease its electrical resistance and heat resistance.

According to another aspect of the present invention, a plurality of semiconductor chips having two principal surfaces front-rear reversed with respect to each other are sandwiched between the two high thermal conductivity insulating substrates.

Therefore, the shape of electrode patterns on the high thermal conductivity insulating substrates can be simplified.

Furthermore, the high thermal conductivity insulating substrates may be made of aluminum nitride. In this case, because the coefficient of thermal expansion of aluminum nitride is close to that of the silicon constituting the semiconductor chip, it is possible to reduce thermal stresses acting between the semiconductor chip and the electrode patterns.

Furthermore, the height of bonding parts of the electrode patterns of the high thermal conductivity insulating substrates, that is, parts to be bonded to the electrodes of the semiconductor chip, may be made higher than that of non-bonding parts, and the sizes of these bonding parts may be made the same as or smaller than the sizes of the respective electrodes of the semiconductor chip. Accordingly, it is possible to prevent runaround of solder and to avoid a guard ring of the semiconductor chip in the bonding.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

FIG. 30 is an exploded longitudinal sectional view showing an IGBT module according to a ninth embodiment of the present invention;

FIG. 31 is a longitudinal sectional view showing the IGBT module according to the ninth embodiment of the present invention;

FIG. 33 is a perspective view showing the IGBT module according to the tenth embodiment of the present invention;

DETAILED DESCRIPTION OF PREFERRED EMBODIMENTS

First Embodiment

Figure 1:
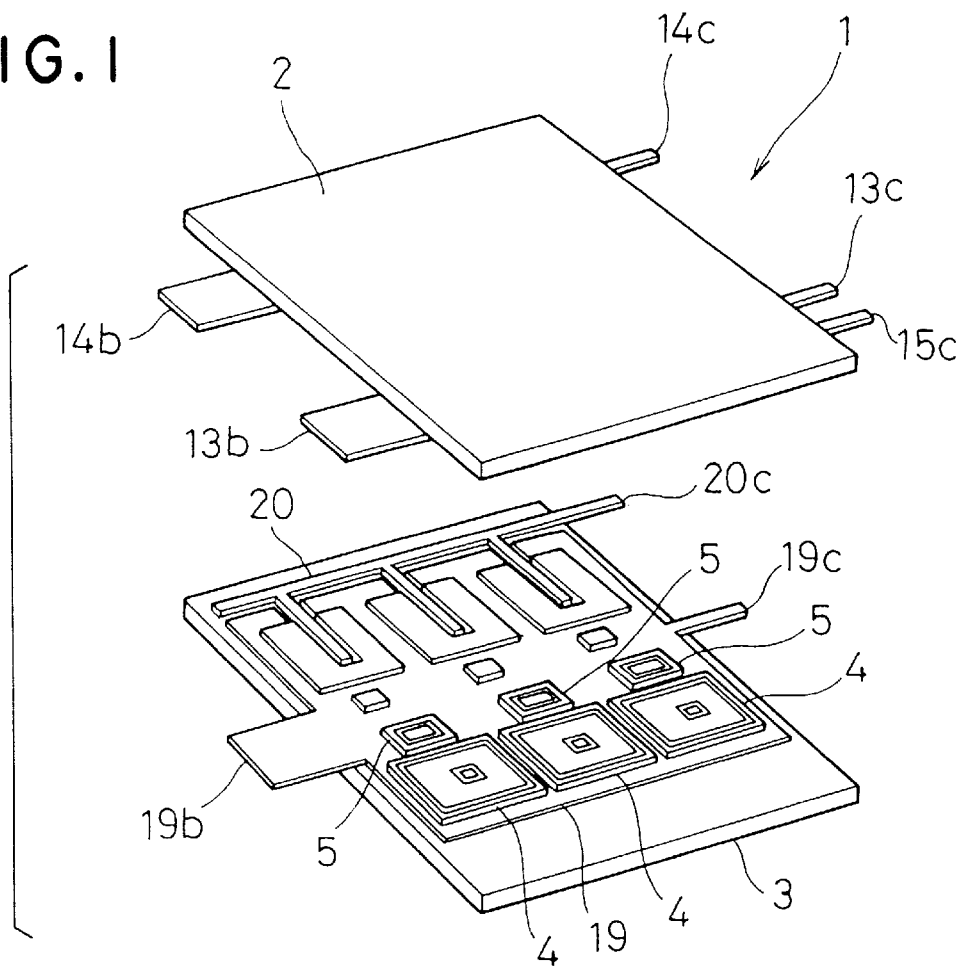
FIG. 1 is an exploded view showing an IGBT module according to a first embodiment of the present invention.
Figure 2:
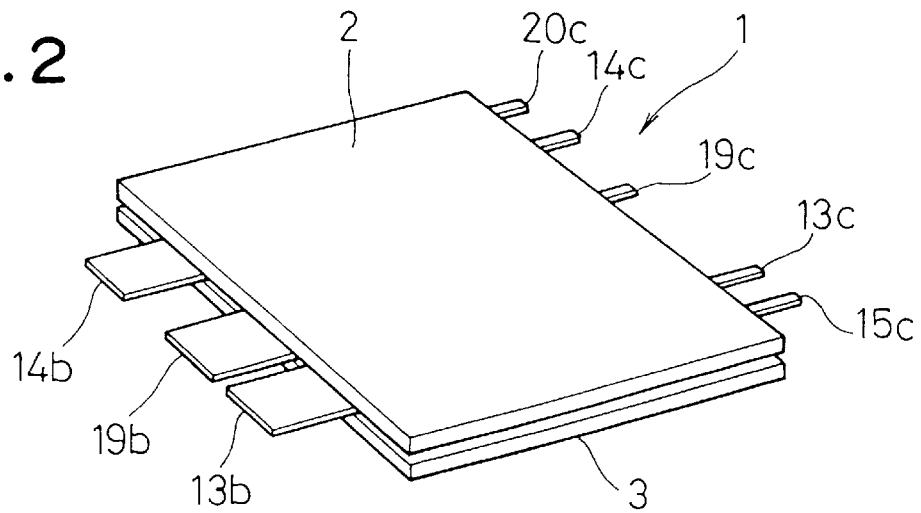
FIG. 2 is a perspective view showing the IGBT module according to the first embodiment of the present invention.

A first preferred embodiment of the present invention applied to an IGBT module will now be described with reference to FIG. 1 through FIG. 12. As shown in FIG. 1 and FIG. 2, an IGBT module 1 consists of for example six IGBT chips 4 and for example six free wheel diode chips 5 (hereinafter called FWD chips 5) sandwiched between two high thermal conductivity insulating substrates 2, 3 (in FIG. 1 only three of each kind of chip are shown). The IGBT chips 4 and the FWD chips 5 are semiconductor chips. Here, the specific construction of the IGBT module 1 will be described later; first, the IGBT chips 4 and the FWD chips 5 will be described.

Figure 9:
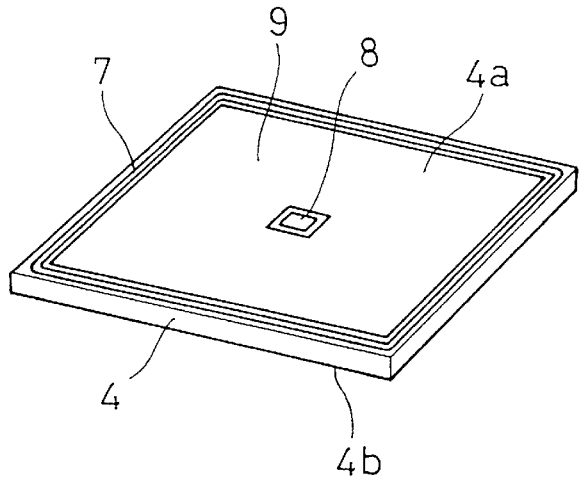
FIG. 9 is a perspective view showing an IGBT chip according to the first embodiment of the present invention.
Figure 10:
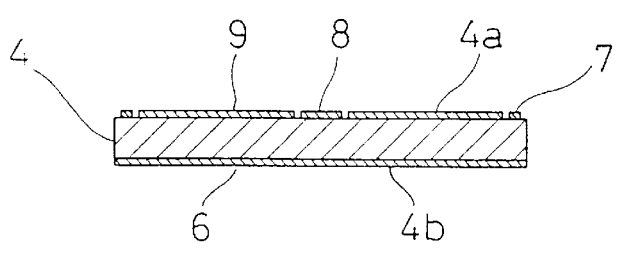
FIG. 10 is a longitudinal sectional view showing the IGBT chip according to the first embodiment of the present invention.

As shown in FIG. 9 and FIG. 10, each of the IGBT chips 4 as a whole is formed in the shape of a substantially square plate and has an upper surface 4a and a lower surface 4b as two principal surfaces. On the lower surface 4b (one principal surface) of each IGBT chips 4, a collector electrode 6 is formed over the entire surface. On the upper surface 4a (the other principal surface) of the IGBT chips 4 a substantially rectangular frame-shaped guard ring 7 is formed around the periphery of the surface, a small rectangular gate electrode 8 is formed in the center of the surface and an emitter electrode 9 is formed in the region between the guard ring 7 and the gate electrode 8. In this case, the collector electrode 6 and the emitter electrode 9 constitute main electrodes and the gate electrode 8 constitutes a control electrode.

Figure 11:
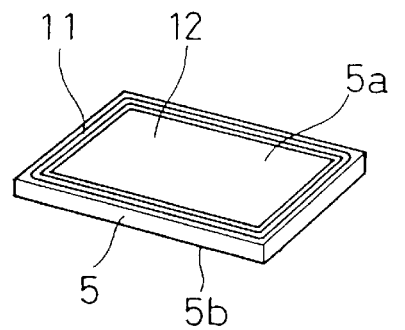
FIG. 11 is a perspective view showing a FWD chip according to the first embodiment of the present invention.
Figure 12:
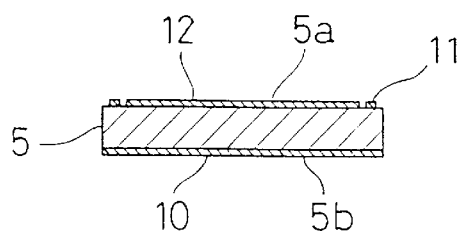
FIG. 12 is a longitudinal sectional view showing the FWD chip according to the first embodiment of the present invention.

As a whole, each of the FWD chips 5 is formed in the shape of a substantially rectangular plate, as shown in FIG. 11. On the lower surface 5b of the FWD chips 5, a rear side electrode 10 is formed over the entire surface as shown in FIG. 12. On the upper surface 5a of the FWD chips 5 a substantially rectangular frame-shaped guard ring 11 is formed around the periphery of the surface and a front side electrode 12 is formed inside the guard ring 11.

Figure 3A:
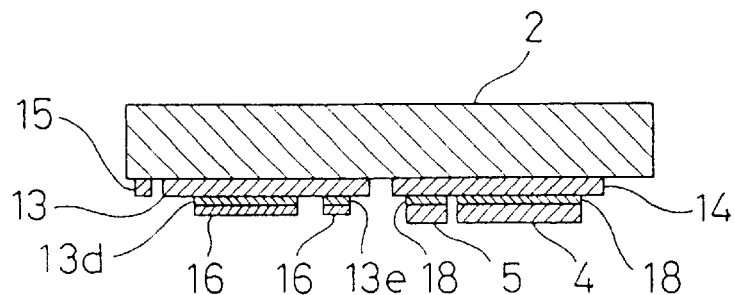
FIGS. 3A, 3B and 3C are enlarged longitudinal sectional views showing manufacturing processes of the IGBT module according to the first embodiment of the present invention.

The specific construction of the IGBT module 1 will now be described with reference to FIG. 1 through FIG. 8. First, each of the two high thermal conductivity insulating substrates 2, 3 consists of a substrate made of for example aluminum nitride. On the lower surface (the surface to sandwich the semiconductor chips) of the upper high thermal conductivity insulating substrate 2, as shown in FIG. 3A and FIG. 7, electrode patterns 13, 14, 15 are disposed. These electrode patterns 13, 14, 15 consist of sheets (of thickness for example 0.5 mm) of copper or aluminum or the like and are directly attached to the lower surface of the high thermal conductivity insulating substrate 2 for example by welding. Or instead of welding they may be attached by brazing (for example soft soldering).

The shapes of the electrode patterns 13, 14, 15 will now be described. First, as shown in FIG. 7, the electrode pattern 13 is made up of a substantially rectangular base part 13a, an external line connection terminal 13b projecting toward the left from the left hand end in FIG. 7 of this base part 13a and protruding from the high thermal conductivity insulating substrate 2, and an external line connection terminal 13c projecting toward the right from the right hand end in FIG. 7 of the base part 13a and protruding from the high thermal conductivity insulating substrate 2. On the base part 13a, three substantially square bonding parts 13d are provided projecting downward; three substantially rectangular bonding parts 13e are also provided projecting downward; and three long and narrow notches 13f are formed so that they severally reach the centers of the bonding parts 13d.

In this case, the size of the three bonding parts 13d is set either substantially equal to or slightly smaller than that of the emitter electrodes 9 of the IGBT chips 4, and the projecting height of the bonding parts 13d is set to for example about 0.5 mm. The size of the three bonding parts 13e is set either substantially equal to or slightly smaller than that of the front side electrodes 12 of the FWD chips 5, and the projecting height of the bonding parts 13e is also set to for example about 0.5 mm. A brazing material (for example soft solder) 16 is attached by printing or plating to the bottom surfaces of the bonding parts 13d, 13e (see FIG. 3A).

The electrode pattern 15, as shown in FIG. 7, is made up of a long and narrow base part 15a, three branch parts 15b branching from this base part 15a and severally extending into the three notches 13f of the electrode pattern 13, and an external line connection terminal 15c projecting toward the right from the right hand end in FIG. 7 of the base part 15a and protruding from the high thermal conductivity insulating substrate 2. Bonding parts 15d are provided projecting downward from end portions of the three branch parts 15b. In this case, the size of the three bonding parts 15d is set substantially equal to or slightly smaller than that of the gate electrodes 8 of the IGBT chips 4, and the projecting height of the bonding parts 15d is set to for example about 0.5 mm. Metal bumps made of gold or solder (not shown) are formed on the bottom surfaces of the bonding parts 15d.

The electrode pattern 14 is made up of a substantially rectangular base part 14a, an external line connection terminal 14b projecting toward the left from the left hand end in FIG. 7 of this base part 14a and protruding from the high thermal conductivity insulating substrate 2, and an external line connection terminal 14c projecting toward the right from the right hand end in FIG. 7 of the base part 14a and protruding from the high thermal conductivity insulating substrate 2. Three IGBT chips 4 and three FWD chips 5 are brazed (for example soft soldered) to the base part 14a. As shown in FIG. 3A, the collector electrodes 6 of the IGBT chips 4 are bonded to the base part 14a by a brazing material (for example soft solder) 18. Similarly, the rear side electrodes 10 of the FWD chips 5 are bonded to the base part 14a by brazing material (for example soft solder) 18.

Figure 3B:
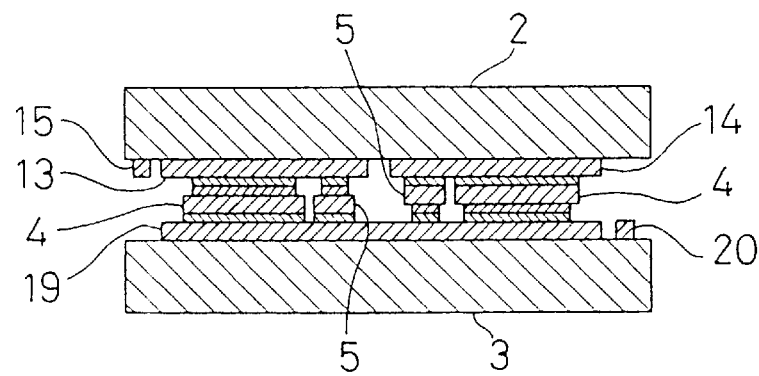
Figure 3C:
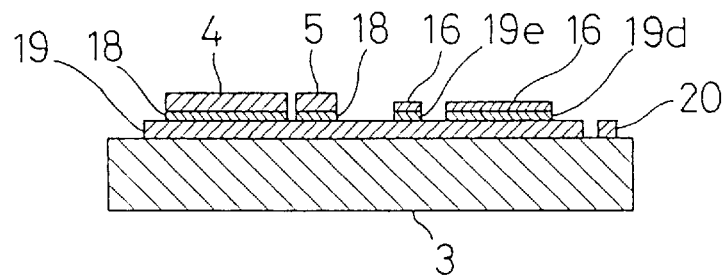
Figure 6:
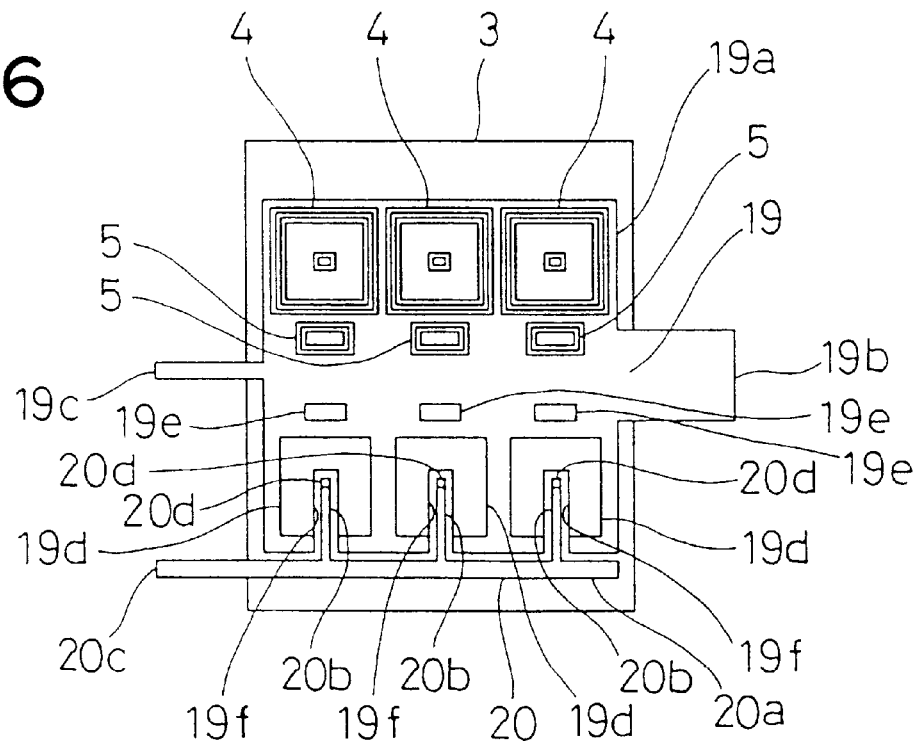
FIG. 6 is a top plan view of a lower high thermal conductivity insulating substrate according to the first embodiment of the present invention.
Figure 7:
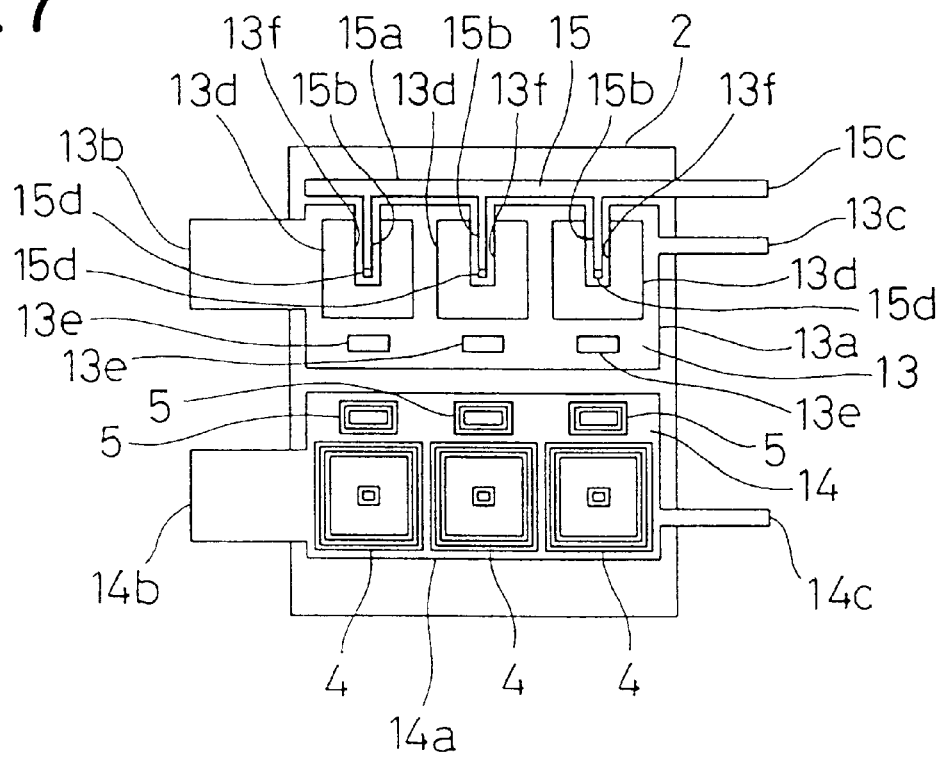
FIG. 7 is a bottom plan view of an upper high thermal conductivity insulating substrate according to the first embodiment of the present invention.

Next, on the upper surface (the surface to sandwich the semiconductor chips) of the lower high thermal conductivity insulating substrate 3, as shown in FIG. 3C and FIG. 6, electrode patterns 19 and 20 are disposed. These electrode patterns 19 and 20 consist of sheets (of thickness for example 0.5 mm) of copper or aluminum or the like and are directly attached to the upper surface of the high thermal conductivity insulating substrate 3 for example by welding. Or instead of welding they may be attached by brazing (for example soft soldering).

Here, first the shape of the electrode pattern 19 will be described. The electrode pattern 19, as shown in FIG. 6, is made up of a substantially square base part 19a, an external line connection terminal 19b projecting toward the right from the right hand end in FIG. 6 of this base part 19a and protruding from the high thermal conductivity insulating substrate 3, and an external line connection terminal 19c projecting toward the left from the left hand end in FIG. 6 of the base part 19a and protruding from the high thermal conductivity insulating substrate 3. On the lower half of the base part 19a in FIG. 6, three substantially square bonding parts 19d are provided projecting upward; three substantially rectangular bonding parts 19e are provided projecting upward; and three long and narrow notches 19f are formed so that they severally reach the centers of the bonding parts 19d.

In this case, the size of the three bonding parts 19d is set substantially equal to or slightly smaller than that of the emitter electrodes 9 of the IGBT chips 4, and the projecting height of the bonding parts 19d is set to for example about 0.5 mm. The size of the three bonding parts 19e is set substantially equal to or slightly smaller than that of the front side electrodes 12 of the FWD chips 5, and the projecting height of the bonding parts 19e is set to for example about 0.5 mm. A brazing material (for example soft solder) 16 is attached by printing or plating to the top surfaces of the bonding parts 19d, 19e (see FIG. 3C).

Three IGBT chips 4 and three FWD chips 5 are brazed (for example soft soldered) to the upper half in FIG. 6 of the base part 19a. As shown in FIG. 3C, the collector electrodes 6 of the IGBT chips 4 are bonded to the base part 19a by a brazing material (for example soft solder) 18. Similarly, the rear side electrodes 10 of the FWD chips 5 are bonded to the base part 19a by brazing material (for example soft solder) 18.

The electrode pattern 20, as shown in FIG. 6, is substantially the same shape as the above-mentioned electrode pattern 15, and is made up of a long and narrow base part 20a, three branch parts 20b branching from this base part 20a and severally extending into the three notches 19f of the electrode pattern 19, and an external line connection terminal 20c projecting toward the left from the left hand end in FIG. 6 of the base part 20a and protruding from the high thermal conductivity insulating substrate 3. Bonding parts 20d are provided projecting upward from end portions of the branch parts 20b. In this case, the size of the three bonding parts 20d is set substantially equal to or slightly smaller than that of the gate electrodes 8 of the IGBT chips 4, and the projecting height of the bonding parts 20d is set to for example about 0.5 mm. Metal bumps made of gold or solder (not shown) are formed on the bottom surfaces of the bonding parts 20d.

In the construction described above, the external line connection terminals 13b, 14b, 19b are main electrode terminals and the external line connection terminals 13c, 14c, 15c, 19c and 20c are control electrode terminals.

Next, the two high thermal conductivity insulating substrates 2, 3 preformed as described above are brought face to face as shown in FIG. 3B so that the six IGBT chips 4 and the six FWD chips 5 are sandwiched between the two high thermal conductivity insulating substrates 2, 3. As a result of this the bonding parts 13d and 13e of the electrode pattern 13 on the upper high thermal conductivity insulating substrate 2 and the emitter electrodes 9 of the IGBT chips 4 and the front side electrodes 12 of the FWD chips 5 on the lower high thermal conductivity insulating substrate 3 side come together with the brazing material 16 therebetween and the bonding parts 15d of the electrode pattern 15 on the upper high thermal conductivity insulating substrate 2 come into contact with the gate electrodes 8 of the IGBT chips 4 on the lower high thermal conductivity insulating substrate 3 side.

At the same time, the bonding parts 19d and 19e of the electrode pattern 19 on the lower high thermal conductivity insulating substrate 3 and the emitter electrodes 9 of the IGBT chips 4 and the front side electrodes 12 of the FWD chips 5 on the upper high thermal conductivity insulating substrate 2 side come together with the brazing material 16 therebetween and the bonding parts 20d of the electrode pattern 20 on the lower high thermal conductivity insulating substrate 3 come into contact with the gate electrodes 8 of the IGBT chips 4 on the upper high thermal conductivity insulating substrate 2 side.

Then, reflow soldering is carried out by the above-mentioned contacting parts being heated with a hot plate or a heating oven or the like. By this means the contacting parts are brazed (specifically, soft soldered) together and the form shown in FIG. 2 and FIG. 3B is obtained. The bonding of the gate electrodes 8 of the IGBT chips 4 with the bonding parts 15d of the electrode pattern 15 and the bonding of the gate electrodes 8 of the IGBT chips 4 with the bonding parts 20d of the electrode pattern 20 is carried out by the metal bumps.

In executing the brazing, a low melting point solder (low melting point soft solder) is used as the brazing material 16, which is brazed afterward, and a high melting point solder (high melting point soft solder) is used as the brazing material 18, which is brazed beforehand. When this is done, at the time of the afterward brazing, the brazing material 16 reflows at a temperature lower than the melting point of the brazing material 18 brazed beforehand, and consequently the brazing material 18 brazed beforehand does not melt.

Figure 4:
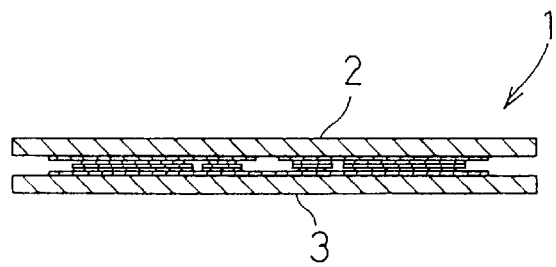
FIG. 4 is a longitudinal sectional view showing the IGBT module according to the first embodiment of the present invention.

In FIGS. 3A, 3B and 3C the thickness direction (the vertical direction in the figures) dimensions are considerably enlarged. FIG. 4 shows these thickness dimensions closer to their actual sizes. As shown in FIG. 4, when the six IGBT chips 4 and the six FWD chips have been sandwiched between the two high thermal conductivity insulating substrates 2 and 3 and bonded, the gap between the high thermal conductivity insulating substrates 2, 3 is for example about 1 mm.

Figure 5:
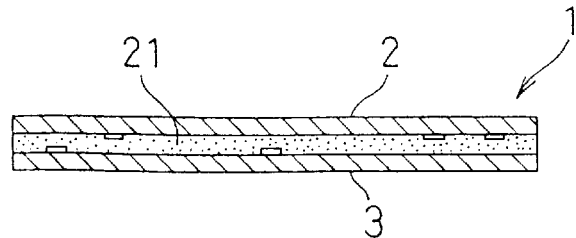
FIG. 5 is a longitudinal sectional view showing the IGBT module filled with an insulating resin according to the first embodiment of the present invention.

After the above-mentioned bonding is carried out, an insulating resin 21 is filled between the two high thermal conductivity insulating substrates 2, 3 and hardened (see FIG. 5). In this way the IGBT module 1 is completed. As the insulating resin 21, for example an epoxy resin containing a filler or a silicone resin is preferably used.

An electrical circuit diagram of an IGBT module 1 manufactured in the way described above is shown in FIG. 8. As shown in this FIG. 8, the collector of a first IGBT 22 is connected to a terminal 23a and a terminal 24a, the emitter of the first IGBT 22 is connected to a terminal 23b and a terminal 24c and the gate of the first IGBT 22 is connected to a terminal 24b. The terminals of a first FWD 25 are connected to the collector and the emitter of the first IGBT 22 with the polarity shown in FIG. 8. The collector of a second IGBT 26 is connected to the emitter (that is, a terminal 23b and a terminal 24c) of the first IGBT 22, the emitter of the second IGBT 26 is connected to a terminal 23c and a terminal 24e, and the gate of the second IGBT 26 is connected to a terminal 24d. The terminals of a second FWD 27 are connected with the polarity shown in FIG. 8 to the collector and the emitter of the second IGBT 26.

In the case of this construction, the first IGBT 22 consists of three IGBT chips 4 (specifically, the three IGBT chips 4 first soldered to the high thermal conductivity insulating substrate 2) connected in parallel. Similarly, the second IGBT 26 consists of three IGBT chips 4 (specifically, the three IGBT chips 4 first soldered to the high thermal conductivity insulating substrate 3) connected in parallel. The reason for connecting the IGBT chips 4 in parallel in groups of three like this is to obtain a large current capacity. Thus the number of IGBT chips 4 connected in parallel in each group can be appropriately determined to suit the current capacity specification of the module.

Figure 8:
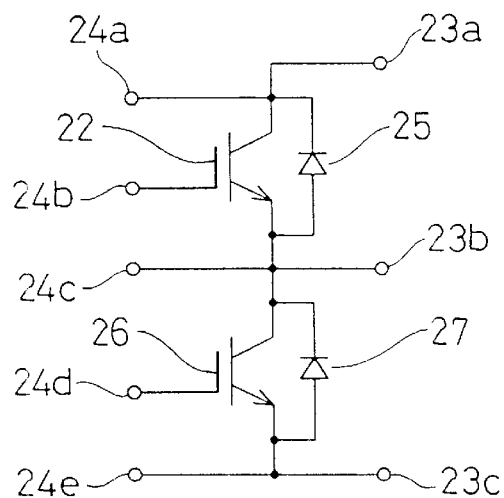
FIG. 8 is an electrical circuit diagram of the IGBT module according to the first embodiment of the present invention.

The terminals 23a to 23c in the electrical circuit diagram of FIG. 8 constitute main electrode terminals, i.e. power terminals, and the terminals 24a to 24e constitute control electrode terminals, i.e. control terminals. The terminals 23a to 23c and 24a to 24e in the electrical circuit diagram of FIG. 8 and the external line connection terminals of the IGBT module 1 correspond as follows. The terminal 23a is the external line connection terminal 14b, the terminal 23b is the external line connection terminal 19b, the terminal 23c is the external line connection terminal 13b, the terminal 24a is the external line connection terminal 14c, the terminal 24b is the external line connection terminal 20c, the terminal 24c is the external line connection terminal 19c, the terminal 24d is the external line connection terminal 15c and the terminal 24e is the external line connection terminal 13c.

According to this first embodiment of the present invention, IGBT chips 4 and FWD chips 5 are sandwiched by two high thermal conductivity insulating substrates 2, 3 and the electrodes of the IGBT chips 4 and the FWD chips 5 and electrode patterns of the high thermal conductivity insulating substrates 2, 3 are bonded by brazing (for example soft soldering) to make an IGBT module 1. Consequently, heat produced by the IGBT chips 4 is transmitted smoothly from the upper surfaces 4a and the lower surfaces 4b of the IGBT chips 4 to the high thermal conductivity insulating substrates 2, 3 and is thereby radiated swiftly. As a result, it is possible to greatly reduce the size of the IGBT module 1. Also, because the electrodes of the IGBT chips 4 and the electrode patterns of the high thermal conductivity insulating substrates 2, 3 are bonded by brazing, the IGBT chips 4 do not have to be pressed and furthermore the area of the bond (connection) parts is large. By this means it is possible to make the current resistance and the heat resistance of the bonds small and it becomes possible to obtain large currents.

Also, in this first embodiment, IGBT chips 4 and FWD chips 5 having their two principal surfaces front-rear reversed with respect to each other are sandwiched between the two high thermal conductivity insulating substrates 2, 3 together. Specifically, three IGBT chips 4 first soldered to the high thermal conductivity insulating substrate 2 and three IGBT chips 4 first soldered to the high thermal conductivity insulating substrate 3 are in a front-rear reversed relationship to each other. When this is done, for example when six IGBT chips 4 are sandwiched between two high thermal conductivity insulating substrates 2 and 3, it is possible for the shapes of the electrode patterns 13, 14, 15, 19 and 20 disposed on the opposing surfaces of the high thermal conductivity insulating substrates 2, 3 to be made relatively simple.

Also, in this first embodiment, external line connection terminals 13b, 13c, 14b, 14c, 15c, 19b, 19c and 20c are provided in the electrode patterns 13, 14, 15, 19 and 20 of the high thermal conductivity insulating substrates 2, 3 in parallel with the plate surfaces (the surfaces on which the electrode patterns are disposed) of the high thermal conductivity insulating substrates 2, 3 and extending outward. By this means, because it is possible to eliminate the work of providing separate terminals for connections to external lines and connecting these terminals to the electrode patterns, the reliability of the module can be raised. And because in this preferred embodiment the external line connection terminals 13b, 13c, 14b, 14c, 15c, 19b, 19c and 20c extend in parallel with the plate surfaces of the high thermal conductivity insulating substrates 2 and 3, it is easy to avoid coolers mounted on the outer surfaces of the high thermal conductivity insulating substrates 2, 3 interfering with lines connected to the external line connection terminals 13b, 13c, 14b, 14c, 15c, 19b, 19c and 20c.

In particular, in this preferred embodiment, among the external line connection terminals, the main electrode terminals 13b, 14b and 19b, which are connected to the main electrodes 6 and 9 of the IGBT chips 4, are provided extending in the same direction, and the control electrode terminals 15c and 20c, which are connected to the gate electrodes 8 of the IGBT chips 4, are provided extending in the opposite direction to the main electrode terminals 13b, 14b and 19b. With this construction, because it becomes easy for control lines and power lines to be kept apart, the construction is resistant to noise, a cooling air flow path can be provided without it interfering with the above-mentioned lines, and the cooling performance improves. Also, it is possible to obtain an effect of reducing the internal inductance of the IGBT module 1.

In this first embodiment, the high thermal conductivity insulating substrates 2, 3 are made from aluminum nitride. In this case, because the coefficient of thermal expansion of aluminum nitride is close to that of the silicon constituting the IGBT chips 4 and the FWD chips 5, thermal stresses acting between the IGBT chips 4 and the FWD chips 5 and the electrode patterns 13, 14, 15, 19 and 20 disposed on the high thermal conductivity insulating substrates 2, 3 are reduced.

Also, in this first embodiment, because in the electrode patterns 13, 14, 15, 19 and 20 on the high thermal conductivity insulating substrates 2, 3 the heights of the bonding parts 13d, 13e, 15d, 19d, 19e and 20d to be bonded to the electrodes of the IGBT chips 4 and the FWD chips 5 are made higher than the non-bonding parts and the sizes of these bonding parts are made the same as or slightly smaller than those of the electrodes of the chips 4 and 5, runaround of solder during soldering can be prevented and the guard rings 7, 11 of the chips 4 and 5 can be avoided in the bonding. Consequently, the soldering operation becomes easy. In this preferred embodiment the heights of the bonding parts were set to 0.5 mm; this is to obtain the necessary withstandable voltage in a 600 V IGBT module 1 having its gaps filled with epoxy resin. Thus the heights of the bonding parts should be determined in accordance with the withstandable voltage required.

In this first embodiment, in brazing (soft soldering) the chips 4 and 5 to the electrode patterns of the high thermal conductivity insulating substrates 2 and 3, the brazing materials 16, 18 are attached by printing or the like to the bonding parts of the electrode patterns; however, instead of this, the brazing materials 16, 18 may be attached by printing or the like to the electrodes (pads) of the chips 4 and 5, or alternatively a foil of a brazing material (solder foil) may be sandwiched between the electrodes of the chips 4 and 5 and the bonding parts of the electrode patterns.

Also, although in this first embodiment the chips 4 and 5 are each soldered to one side of one of the high thermal conductivity insulating substrates 2, 3 and then the high thermal conductivity insulating substrates 2, 3 are brought together and another soldering operation is carried out, instead of this the chips 4 and 5 may be brazed to the high thermal conductivity insulating substrates 2, 3 by a single soldering operation being carried out with the chips 4 and 5 sandwiched between the high thermal conductivity insulating substrates 2, 3. In this case, the same solder (a high melting point solder) is used for the brazing materials 16 and 18. And a spacer is inserted between the two high thermal conductivity insulating substrates 2, 3. The thickness of this spacer is determined taking into account the thickness of the chips 4 and 5 and the thickness of the solder after reflowing.

The coefficient of thermal expansion of the spacer is preferably the same as or slightly larger than the mean coefficient of thermal expansion of the components held between the high thermal conductivity insulating substrates 2, 3. Also, at the time of the above-mentioned soldering, during the reflowing, the chips 4 and 5 float on molten solder. In this case, because in the electrode patterns the bonding parts to be bonded to the electrodes on the front sides of the chips 4 and 5 are higher than (project beyond) the other parts, solder does not flow out to outside the bonding parts. Consequently, even if the positions of the chips 4 and 5 initially are somewhat off, the chips 4 and 5 are positioned in alignment with the bonding parts by the surface tension of the solder.

In this first embodiment, the gate electrodes 8 of the IGBT chips 4 and the bonding parts 15e of the electrode pattern 15, and the gate electrodes 8 of the IGBT chips 4 and the bonding parts 20d of the electrode pattern 20, are bonded using metal bumps; however, this is not because of any limitation, and if these parts are solderable, they may alternatively be soldered. Because the current flowing through the gate electrodes 8 of the IGBT chips 4 is extremely small, the gate electrodes 8 and the bonding parts of the electrode patterns can be bonded using an ordinary metal bump (one metal bump) without any problem arising.

Also, although in this first embodiment the main electrodes on the upper surface sides of the IGBT chips 4 and the respective bonding parts of the electrode patterns of the high thermal conductivity insulating substrates 2, 3 are bonded by soldering, this is not because of any limitation. Specifically, preferably several tens to several hundreds metal bumps are formed in concentration on the main electrodes on the upper surface sides of the chips 4 and the main electrodes are bonded to the respective bonding parts of the electrode patterns by way of these concentrated metal bumps. As the material of these metal bumps, gold or solder is preferable. When gold bumps are formed, tin is deposited on the surfaces to be bonded to the gold bumps (the bonding parts of the electrode patterns) and bonding is effected by a eutectic reaction between the gold and the tin.

This construction, because there is no risk of bridging of the brazing material (bonding material), is suitable when the IGBT chips 4 are relatively small. In the case of this construction, because many metal bumps are provided in concentration, the current capacity increases, the heat resistance decreases, and the same effects as those described above can be obtained.

Although in the first embodiment the main electrodes on the lower surface sides of the IGBT chips 4 and the respective electrode patterns on the high thermal conductivity insulating substrates 2, 3 are bonded by soldering, this is not because of any limitation, and if it is possible for the main electrodes and the electrode patterns to be bonded directly by welding or the like then they may be bonded directly.

Although in the first embodiment described above six IGBT chips 4 were held between the high thermal conductivity insulating substrates 2 and 3, this is not because of any limitation, and alternatively one, two to five, or seven or more semiconductor chips may be held between the high thermal conductivity insulating substrates 2, 3.

Second Embodiment

Figure 13:
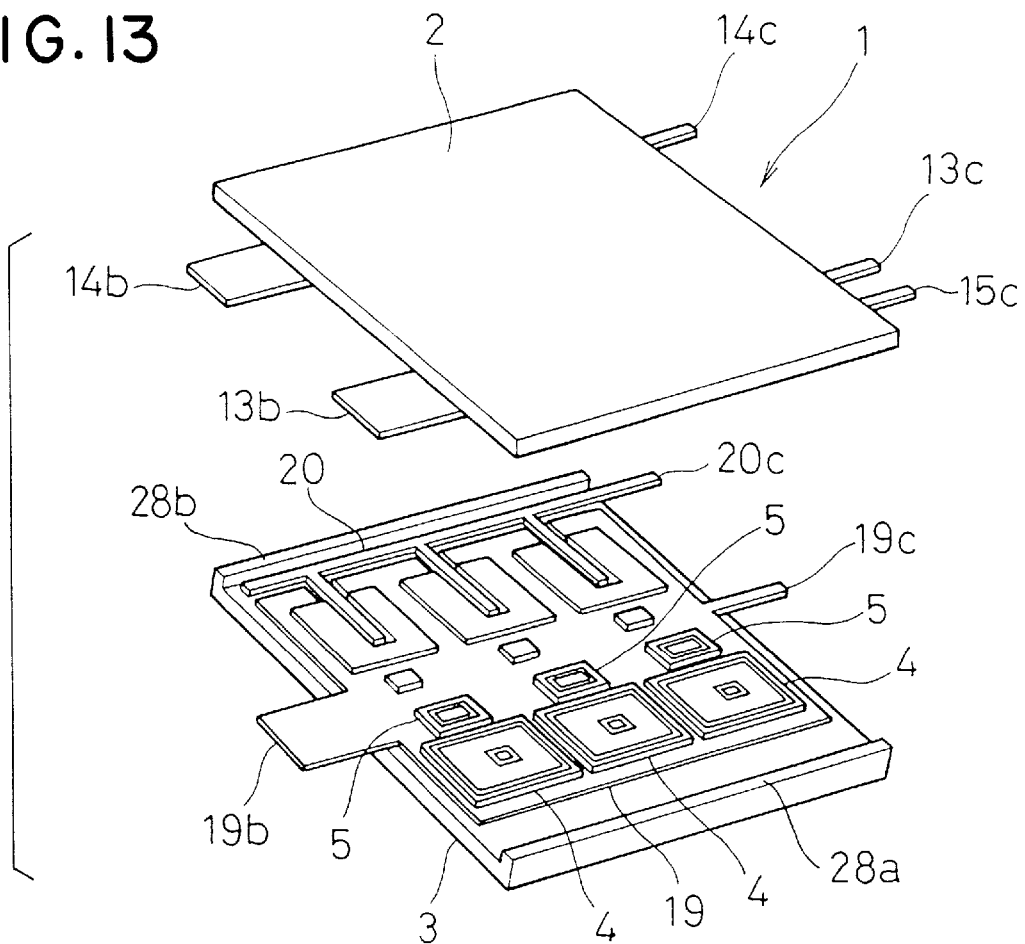
FIG. 13 is an exploded view showing an IGBT module according to a second embodiment of the present invention.
Figure 14:
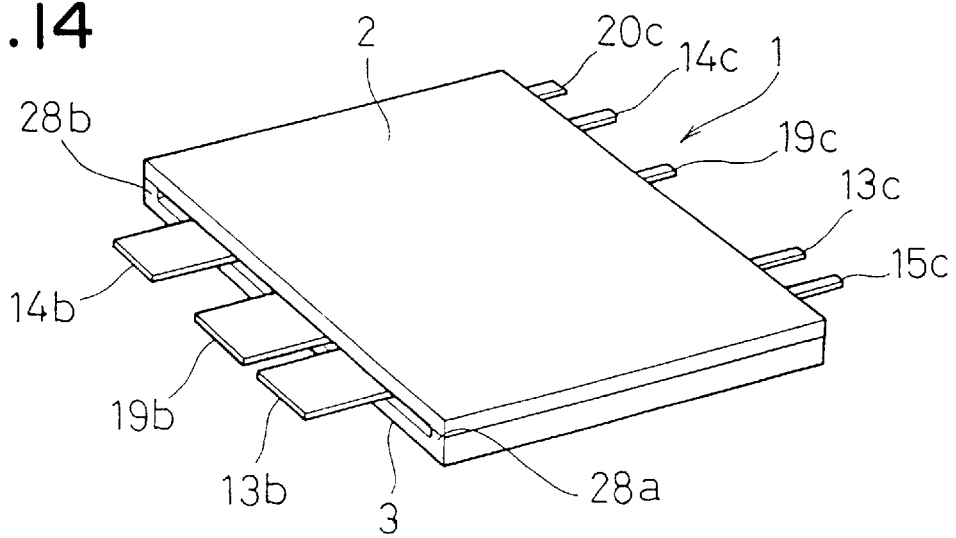
FIG. 14 is a perspective view showing the IGBT module according to the second embodiment of the present invention.

FIG. 13 and FIG. 14 show a second embodiment of the present invention, and differences between this second preferred embodiment and the first preferred embodiment will now be described. In this and the following embodiments, components which are substantially the same as those in previous embodiments are assigned the same reference numerals. In this second embodiment, as shown in FIG. 13, lip parts(protrusions) 28a, 28b are provided along both ends of the inner surface, i.e. the surface sandwiching the IGBT chips 4, of the lower high thermal conductivity insulating substrate 3, that is, of at least one of the high thermal conductivity insulating substrates 2 and 3. And the tops of these lip parts 28a, 28b are bonded by for example soldering to the inner surface i.e. the surface sandwiching the IGBT chips 4, of the upper high thermal conductivity insulating substrate 2, that is, the other high thermal conductivity insulating substrate (see FIG. 14).

With this construction, because the lip parts 28a, 28b can be utilized as spacers for maintaining the gap between the two high thermal conductivity insulating substrates 2 and 3, it is not necessary for a spacer to be provided separately and the number of parts can be reduced. The rest of the construction of the second embodiment is the same as that of the first embodiment.

Third Embodiment

Figure 15:
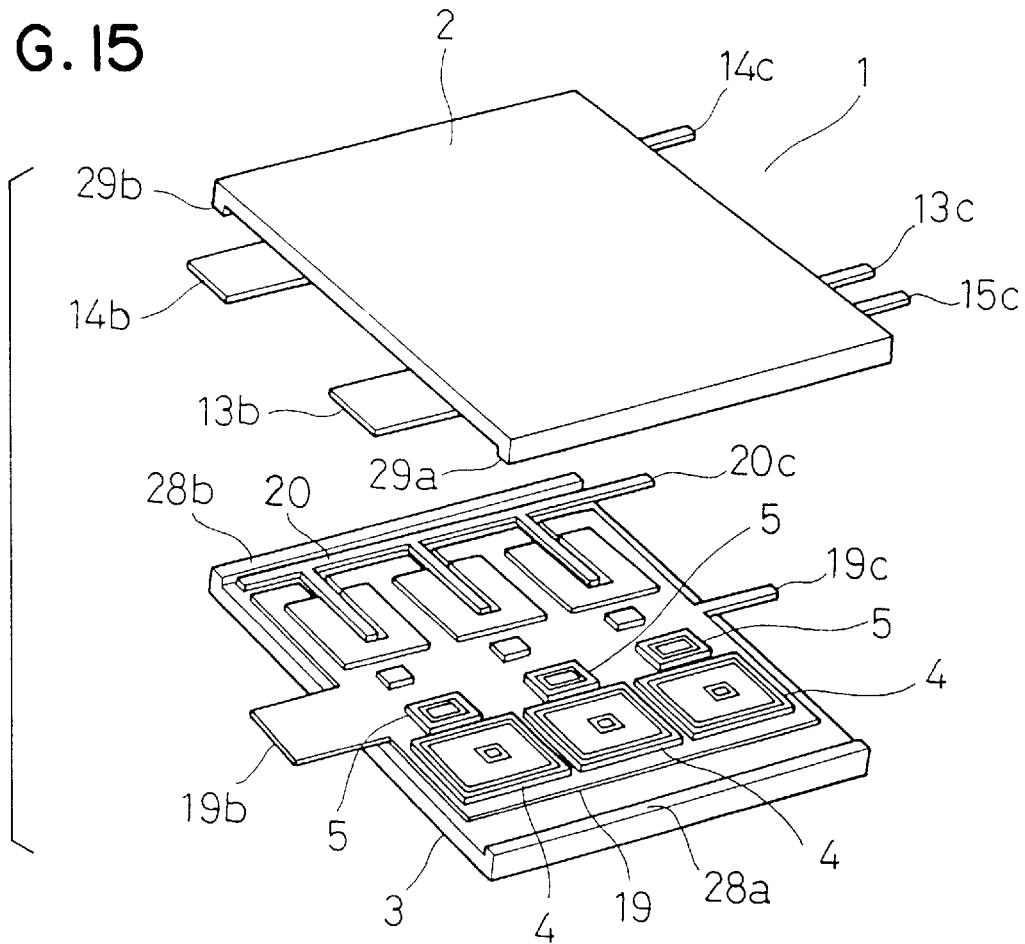
FIG. 15 is an exploded view showing an IGBT module according to a third embodiment of the present invention.
Figure 16:
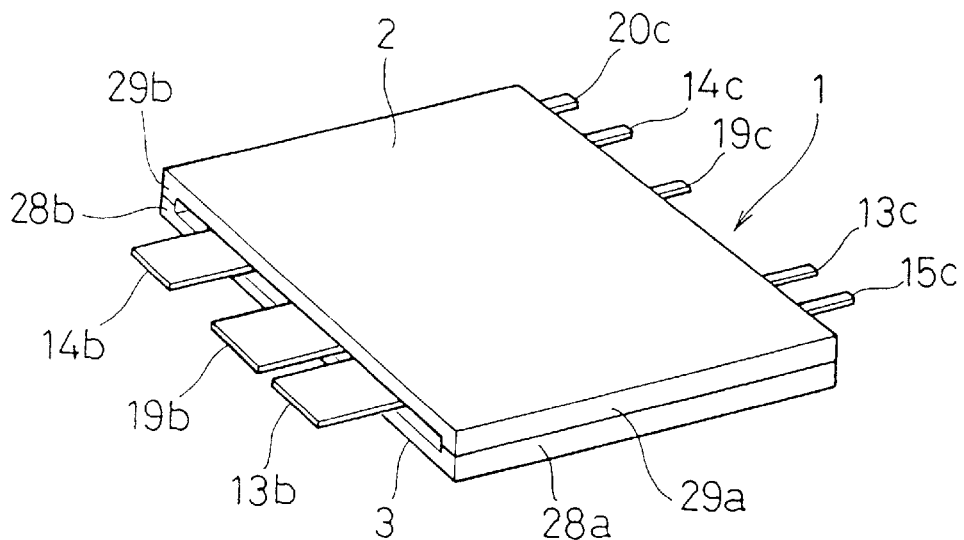
FIG. 16 is a perspective view showing the IGBT module according to the third embodiment of the present invention.

In the second embodiment described above, lip parts 28a, 28b are provided on just one of the high thermal conductivity insulating substrates, the high thermal conductivity insulating substrate 3; however, instead of this, as shown in FIG. 15 and FIG. 16, lip parts 28a, 28b and lip parts 29a, 29b may be provided on both of the high thermal conductivity insulating substrates 2, 3 and the tops of the lip parts 28a, 28b and the lip parts 29a, 29b then bonded to each other. With this kind of construction also it is possible to obtain the same effects as those of the second embodiment.

Fourth Embodiment

Figure 17:
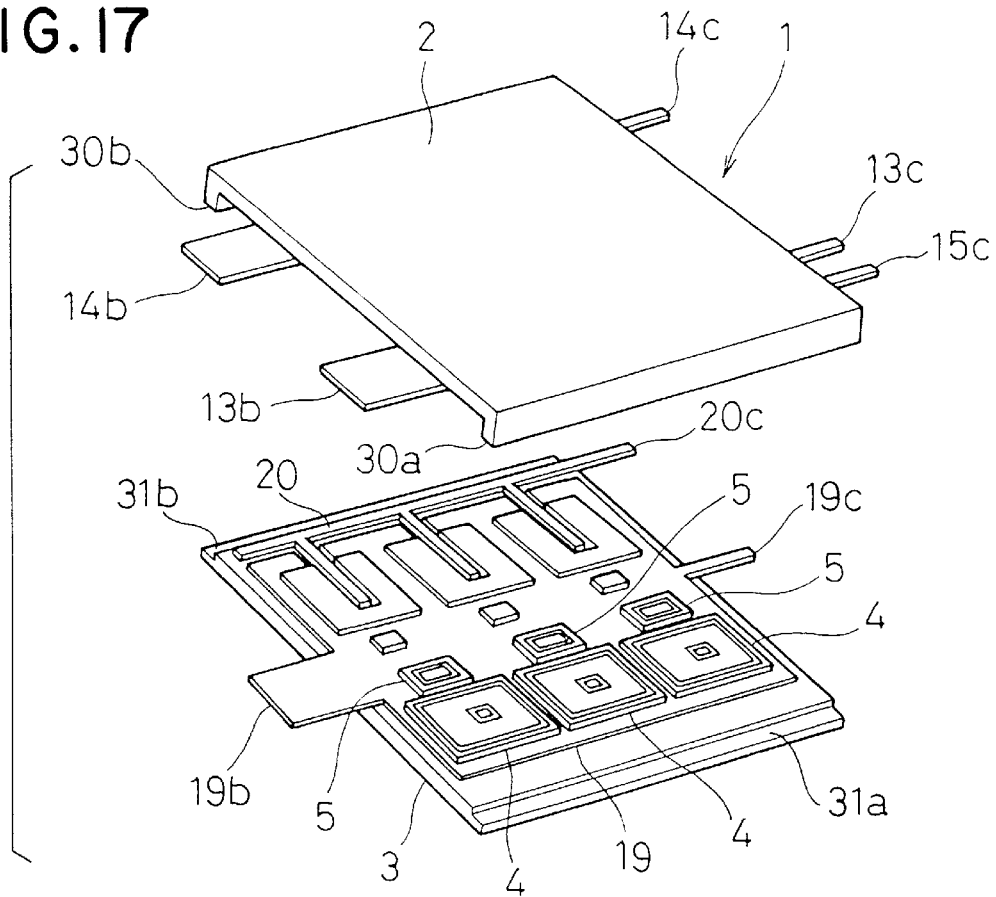
FIG. 17 is an exploded view showing an IGBT module according to a fourth embodiment of the present invention.
Figure 18:
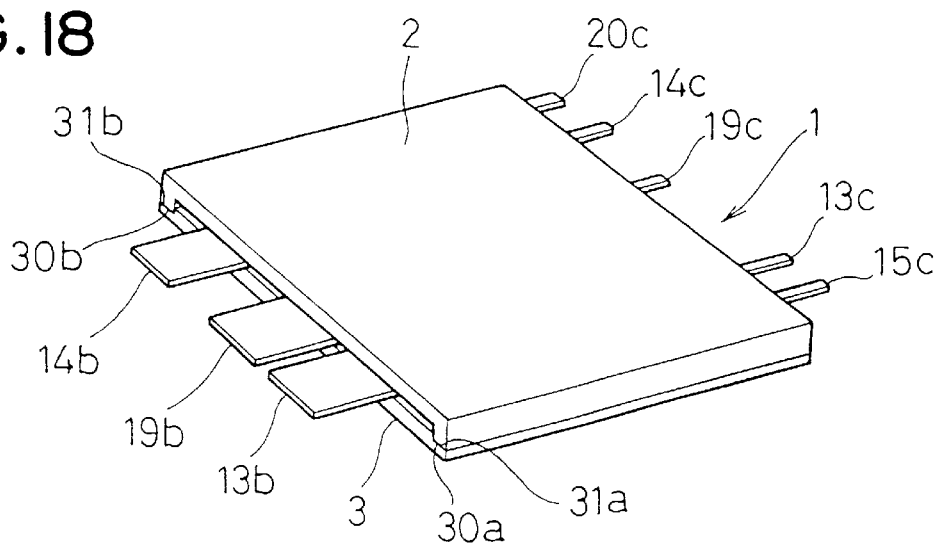
FIG. 18 is a perspective view showing the IGBT module according to the fourth embodiment of the present invention.
Figure 19:
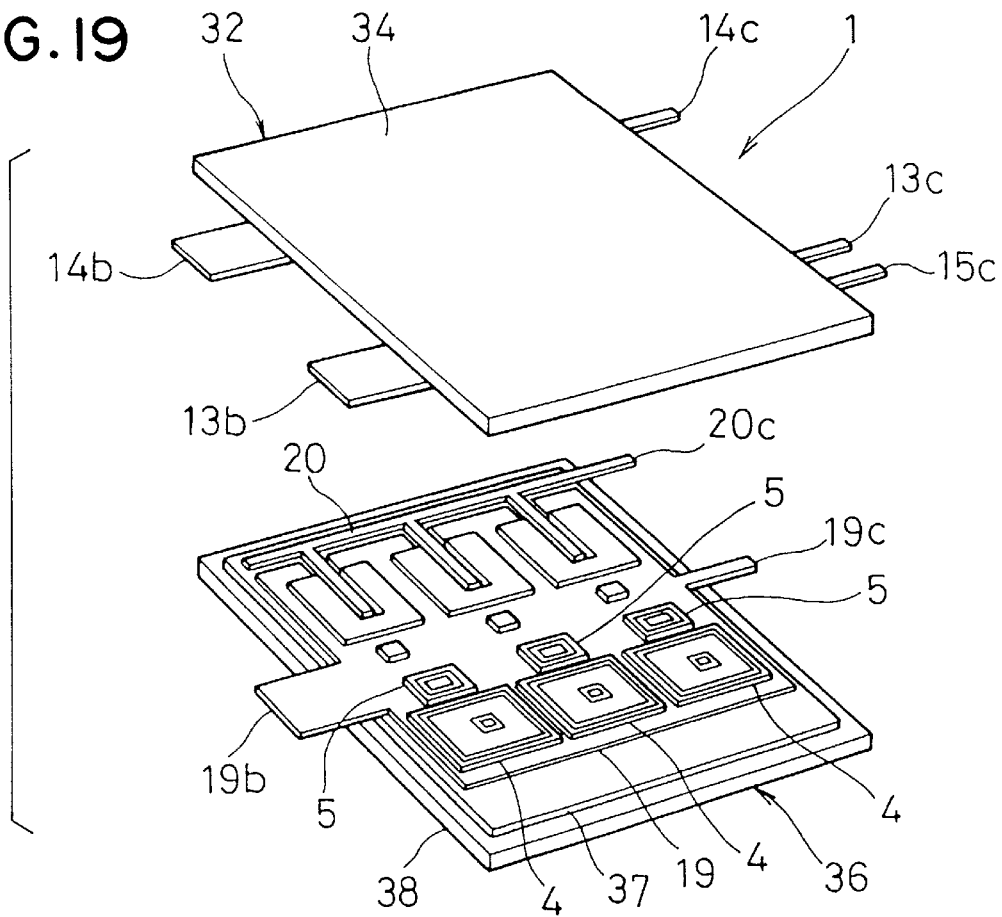
FIG. 19 is an exploded view showing an IGBT module according to a fifth embodiment of the present invention.

FIG. 17 and FIG. 18 show a fourth preferred embodiment of the present invention, and differences between this fourth preferred embodiment and the second embodiment will now be described. In this fourth embodiment, lip parts 30a, 30b are provided along both ends of the lower surface of the upper high thermal conductivity insulating substrate 2. Also, grooves 31a, 31b are provided along both ends of the upper surface of the lower high thermal conductivity insulating substrate 3. And when the two high thermal conductivity insulating substrates 2, 3 are brought face to face, the tops of the lip parts 30a, 30b are fitted into and bonded to the grooves 31a, 31b (see FIG. 18).

Thus in this fourth preferred embodiment, because lip parts 30a, 30b of one of the high thermal conductivity insulating substrates, in this case the high thermal conductivity insulating substrate 2, are fitted into and bonded to grooves 31a, 31b of the other high thermal conductivity insulating substrates, in this case the high thermal conductivity insulating substrate 3, the two high thermal conductivity insulating substrates 2, 3 are correctly positioned with respect to each other.

In the cases of the second through fourth preferred embodiments described above, because the lip parts 28a, 28b, 29a, 29b, 30a and 30b are used as spacers and the two high thermal conductivity insulating substrates 2, 3 are bonded together using these lip parts, as the brazing material (soft solder) used for the soldering (soft soldering) of the main electrodes on one principal surface of the IGBT chips 4 to the bonding parts of the electrode patterns, a brazing material (soft solder) consisting of a low melting point electrically conducting material which softens or liquefies at the operating temperature of the IGBT chips 4 can be used.

When this is done, because the brazing material (soft solder) softens or liquefies when the IGBT chips 4 are operating, there is no accumulating of fatigue at the bonds and no thermal stresses are applied to the bonds Even if the brazing material (soft solder) softens or liquefies, because the two high thermal conductivity insulating substrates 2, 3 are bonded together by the lip parts 28a, 28b, 29a, 29b, 30a and 30b, strength problems do not arise. By this means it is possible to realize an IGBT module 1 having a construction which is strong with respect to thermal cycles. In the case of this construction, as the low melting point electrically conducting material, indium, gallium or low temperature solder is preferably used.

Fifth Embodiment

Figure 20:
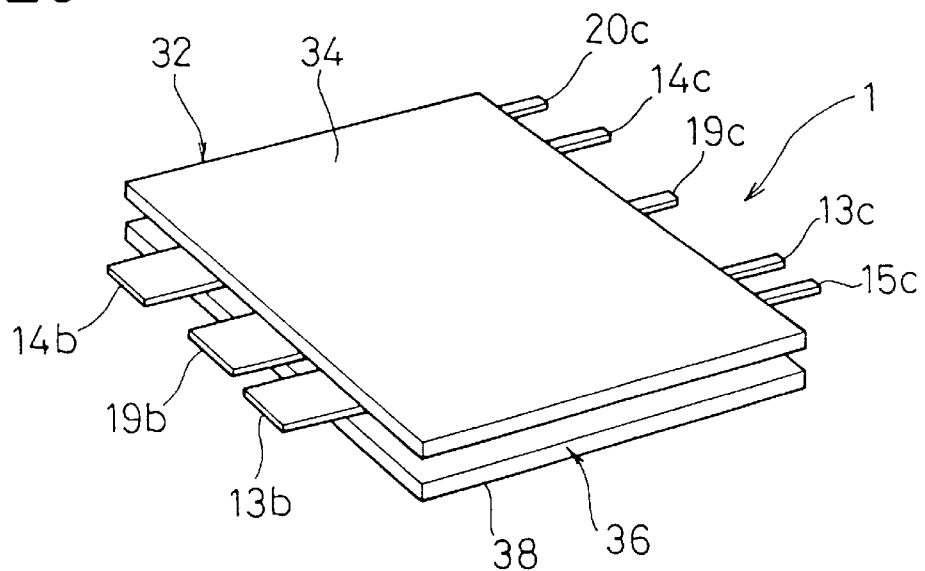
FIG. 20 is a perspective view showing the IGBT module according to the fifth embodiment of the present invention.
Figure 21:
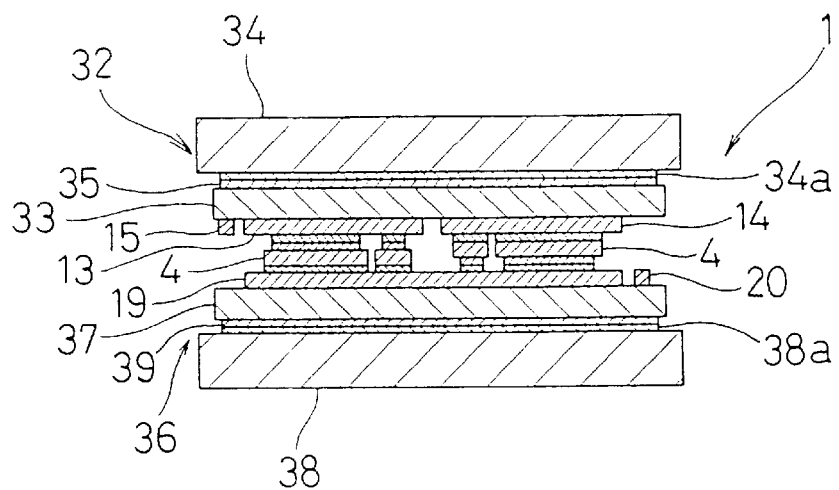
FIG. 21 is an enlarged longitudinal sectional view showing manufacturing processes of the IGBT module according to the fifth embodiment of the present invention.

FIG. 19 through FIG. 23 show a fifth embodiment of the present invention, and differences between this fifth preferred embodiment and the first preferred embodiment will now be described. In this fifth embodiment, the high thermal conductivity insulating substrates are made by combining high thermal conductivity members and insulating members. Specifically, as shown in FIG. 21, an upper high thermal conductivity insulating substrate 32 is made up of for example an aluminum nitride substrate 33, which is an insulating member, and for example a copper plate 34, which is a high thermal conductivity member. The aluminum nitride substrate 33 is a substrate thinner than the high thermal conductivity insulating substrate (aluminum nitride substrate) 2 of the first preferred embodiment, and a copper film 35 is formed on the upper surface thereof in FIG. 21. In the case of this construction, the two are integrated by the copper plate 34 being bonded to the upper surface in FIG. 21 of the copper film 35 on the aluminum nitride substrate 33 by for example soldering (a brazing material 34a).

The copper plate 34 is made slightly larger than the aluminum nitride substrate 33. In the same way as in the case of the high thermal conductivity insulating substrate 2 of the first preferred embodiment, electrode patterns 13, 14, 15, IGBT chips 4 and FWD chips 5 are provided on the lower surface in FIG. 21 of the aluminum nitride substrate 33.

A lower high thermal conductivity insulating substrate 36, in the same way as the upper high thermal conductivity insulating substrate 32 described above, is made up of for example an aluminum nitride substrate 37, which is an insulating member, and for example a copper plate 38, which is a high thermal conductivity member. The aluminum nitride substrate 37 is a substrate thinner than the high thermal conductivity insulating substrate (aluminum nitride substrate) 3 of the first preferred embodiment, and a copper film 39 is formed on the lower surface thereof in FIG. 21. The copper plate 38 is bonded to the lower surface in FIG. 21 of the copper film 39 on the aluminum nitride substrate 37 by for example soldering (a brazing material 38a).

The copper plate 38 is made slightly larger than the aluminum nitride substrate 37. Also, electrode patterns 19 and 20, IGBT chips 4, and FWD chips 5 are provided on the upper surface in FIG. 21 of the aluminum nitride substrate 37 in the same way as on the high thermal conductivity insulating substrate 3 of the first embodiment.

Figure 22:
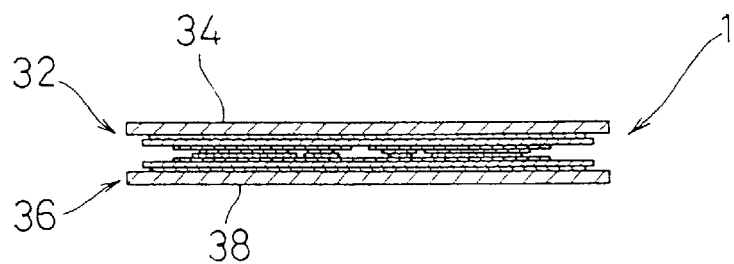
FIG. 22 is a longitudinal sectional view showing the IGBT module according to the fifth embodiment of the present invention.
Figure 23:
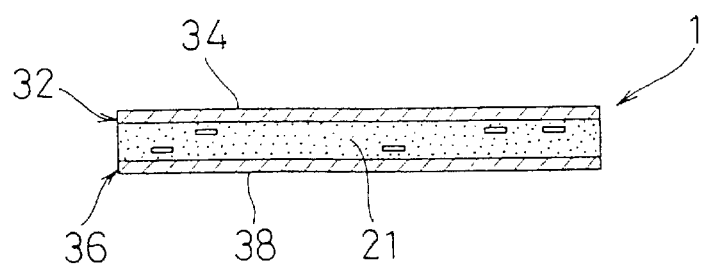
FIG. 23 is a longitudinal sectional view showing the IGBT module filled with an insulating resin according to the fifth embodiment of the present invention.

The operation of bringing the two high thermal conductivity insulating substrates 32, 36 described above face to face and bonding them together by soldering is the same as the bonding operation of the first preferred embodiment. As a result of this bonding, the form shown FIG. 20 and FIG. 22 is obtained. Then, an insulating resin 21 such as epoxy resin or silicone resin is filled between the two bonded high thermal conductivity insulating substrates 32, 36 and hardened, whereby an IGBT module 1 of the kind shown in FIG. 23 is obtained.

The rest of the construction of the fifth embodiment is the same as that of the first preferred embodiment. Accordingly, in this fifth preferred embodiment also, the same effects as those of the first preferred embodiment can be obtained. In particular, in the fifth preferred embodiment, because the high thermal conductivity insulating substrates 32, 36 are made by bonding together copper plates 34, 38 and aluminum nitride substrates 33 and 37, thin substrates, that is, cheap substrates, can be used for the aluminum nitride substrates 33 and 37, and because also the copper plates 34, 38 are cheap, it is possible to reduce the manufacturing cost of the high thermal conductivity insulating substrates 32, 36.

In the fifth preferred embodiment described above, aluminum nitride substrates 33, 37 are used as the insulating members; however, instead of these, substrates made of a ceramic, for example alumina, may be used. And although in this fifth preferred embodiment copper plates 34, 38 are used as the high thermal conductivity members, this is not because of any limitation and for example a composite of silicon carbide and aluminum may alternatively be used. In this case, if aluminum films are formed on the aluminum nitride substrates 33, 37 instead of the copper films 35 and 39, it is easy to weld the above-mentioned composite of silicon carbide and aluminum to these aluminum films. For the high thermal conductivity members, from the point of view of the heat radiation performance, preferably either copper, a silicon carbide ceramic, a material made by impregnating silicon carbide with a metal, or a composite material formed by casting a metal to which silicon carbide has been added is used.

Sixth Embodiment

Figure 24:
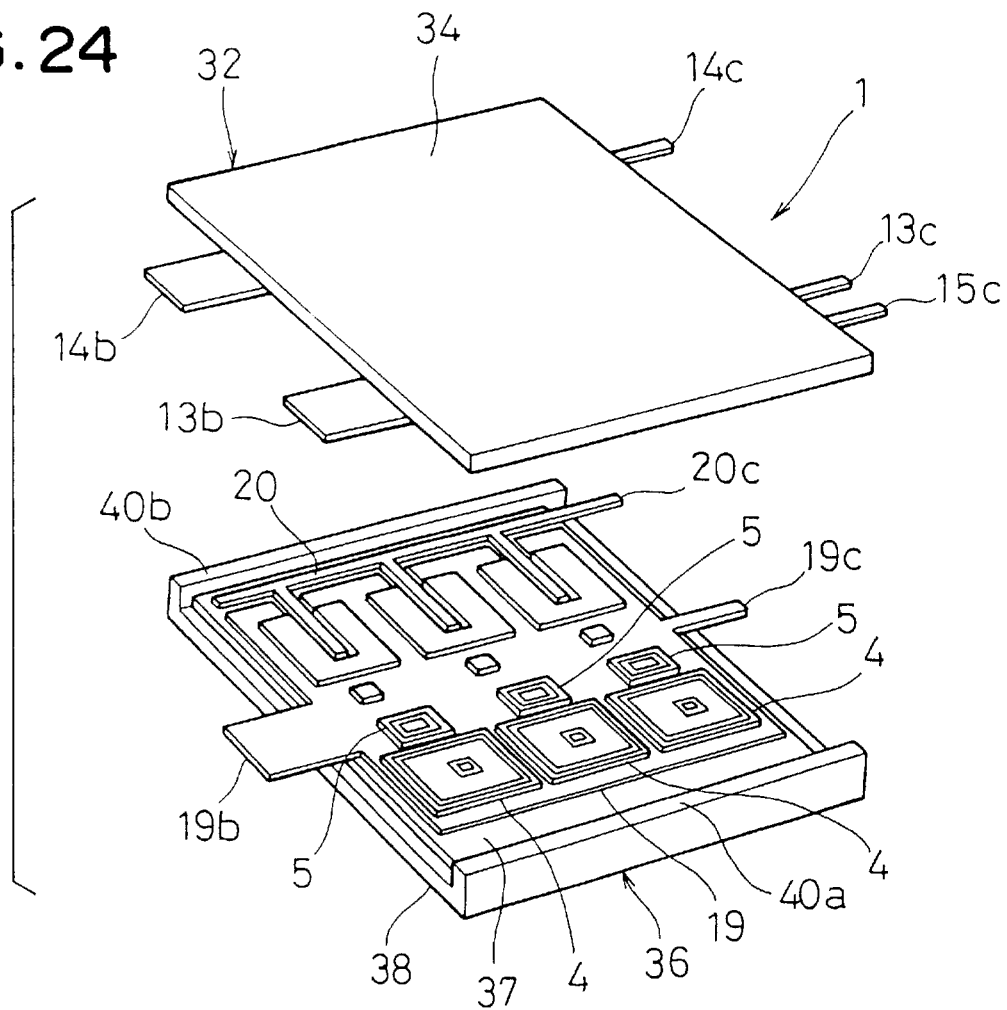
FIG. 24 is an exploded view showing an IGBT module according to a sixth embodiment of the present invention.
Figure 25:
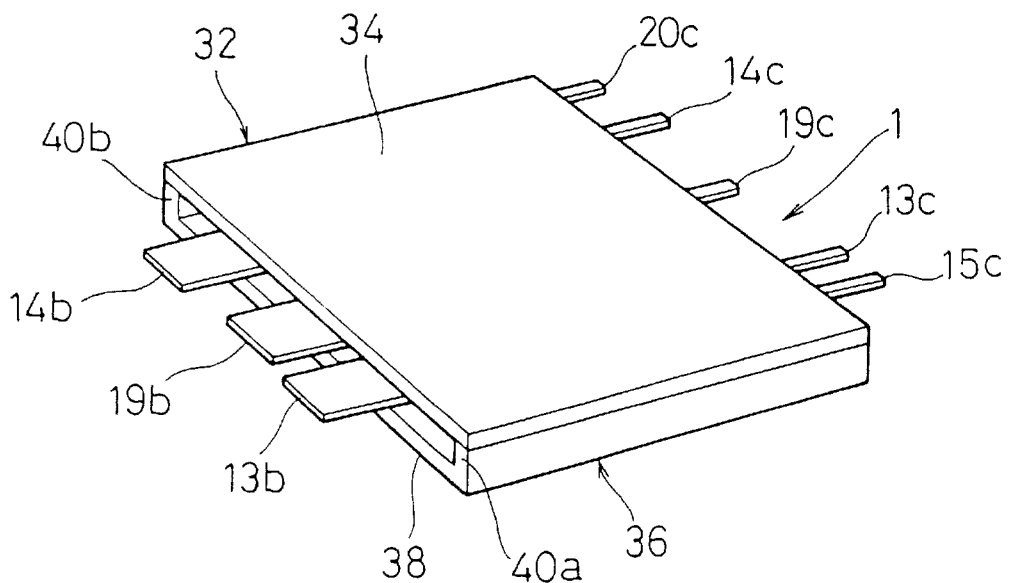
FIG. 25 is a perspective view showing the IGBT module according to the sixth embodiment of the present invention.

FIG. 24 and FIG. 25 show a sixth embodiment of the present invention, and differences between this sixth embodiment and the fifth embodiment will now be described. In this sixth embodiment, as shown in FIG. 24, lip parts 40a, 40b are provided on the upper surface of the copper plate 38 of the lower high thermal conductivity insulating substrate 36, along both ends thereof, where the aluminum nitride substrate 37 is not present. The tops of these lip parts 40a, 40b are bonded by for example soldering to the lower surface of the copper plate 34 of the upper high thermal conductivity insulating substrate 32, along the ends thereof, where the aluminum nitride substrate 33 is not present (see FIG. 25).

With this construction, because the lip parts 40a, 40b can be utilized as spacers for maintaining the gap between the two high thermal conductivity insulating substrates 32 and 36, it is not necessary for a spacer to be provided separately and the number of parts can be reduced. The rest of the construction of the sixth embodiment described above is the same as that of the fifth embodiment.

Seventh Embodiment

Figure 26:
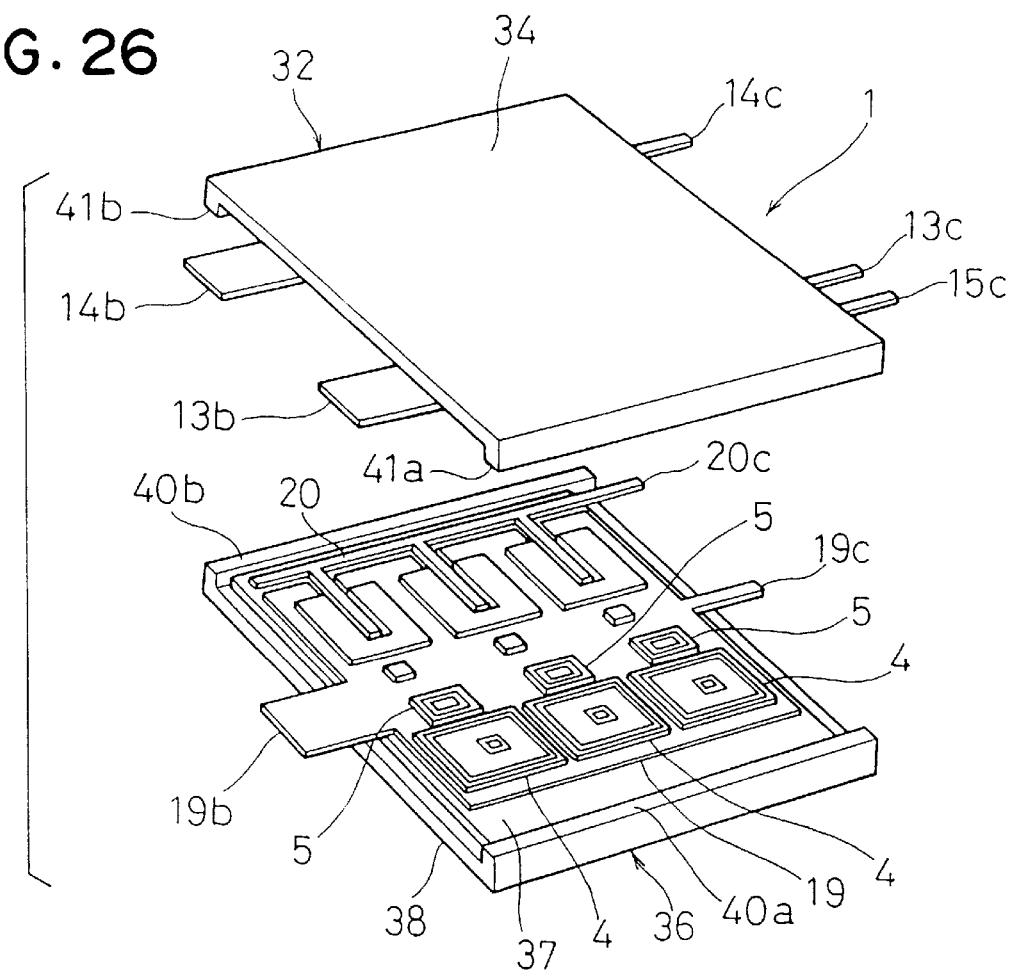
FIG. 26 is an exploded view showing an IGBT module according to a seventh embodiment of the present invention.
Figure 27:
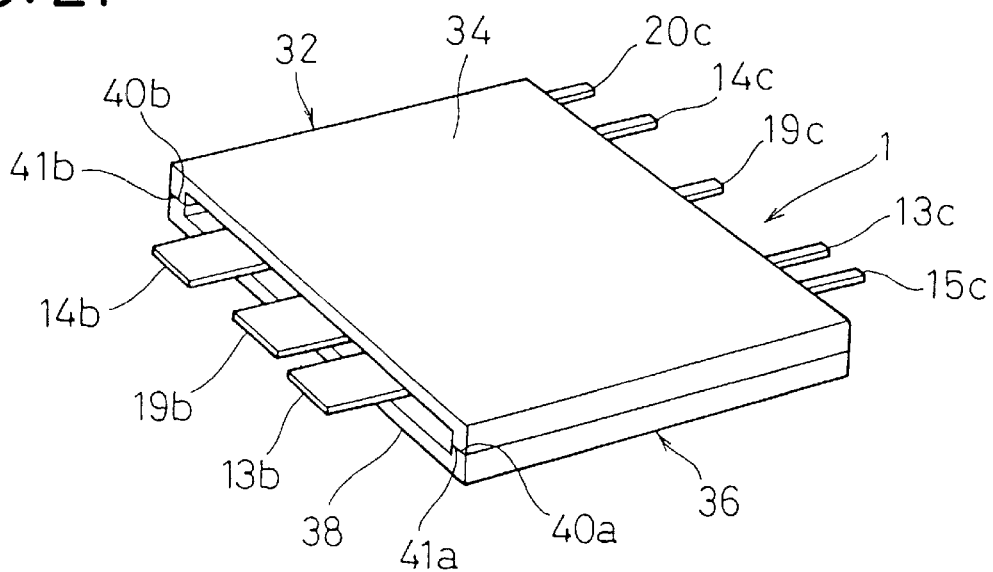
FIG. 27 is a perspective view showing the IGBT module according to the seventh embodiment of the present invention.

In the sixth embodiment described above, lip parts 40a, 40b were provided on the copper plate 38 of the high thermal conductivity insulating substrate 36 only, but instead of this, as in a seventh preferred embodiment shown in FIG. 26 and FIG. 27, lip parts 40a, 40b and lip parts 41a, 41b may be provided on the copper plates 34, 38 of both of the two high thermal conductivity insulating substrates 32, 36 and the tops of these lip parts 40a, 40b and lip parts 41a, 41b then bonded to each other. With this construction also it is possible to obtain the same effects as those of the sixth embodiment.

Eighth Embodiment

Figure 28:
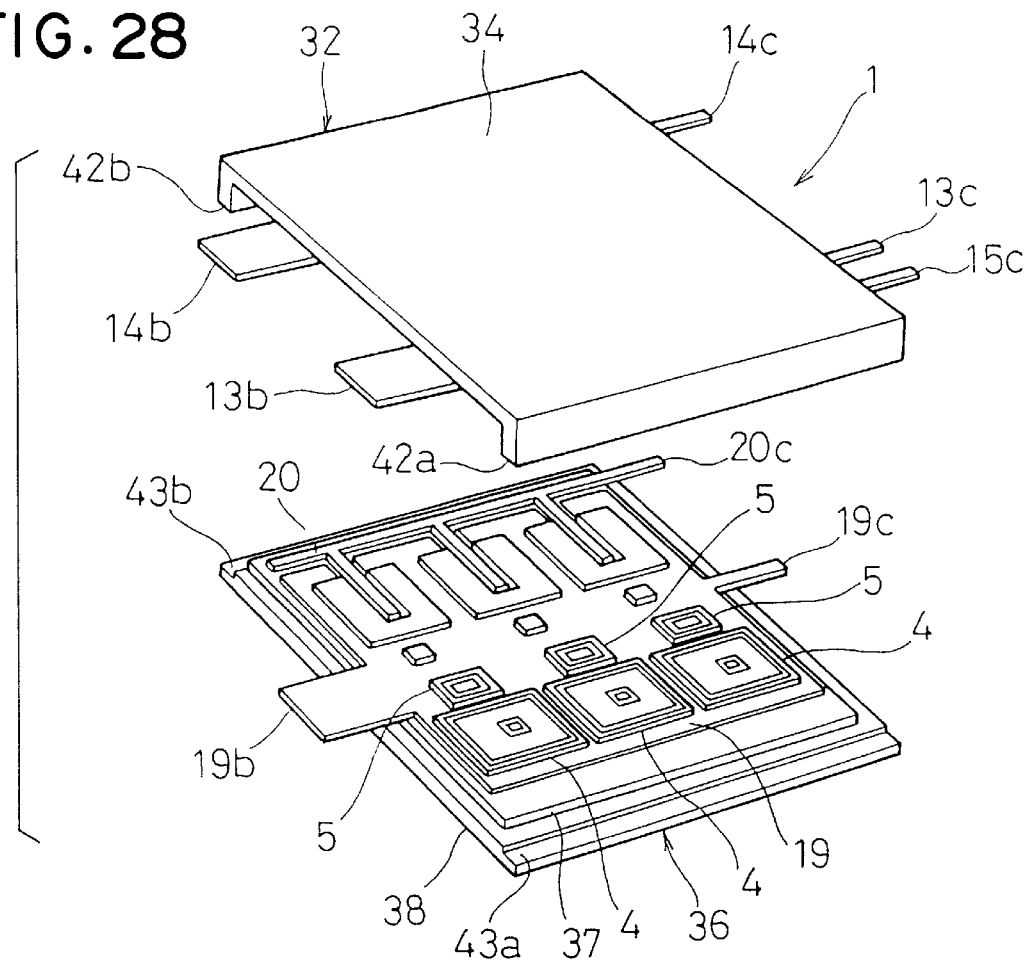
FIG. 28 is an exploded view showing an IGBT module according to an eighth embodiment of the present invention.
Figure 29:
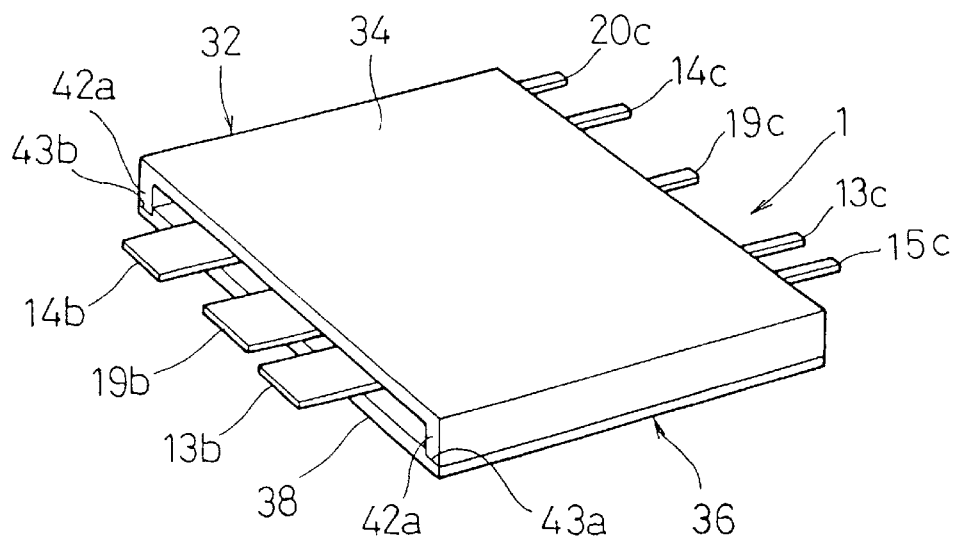
FIG. 29 is a perspective view showing the IGBT module according to the eighth embodiment of the present invention.

FIG. 28 and FIG. 29 show an eighth embodiment of the present invention, and differences between this eighth embodiment and the sixth embodiment will now be described. In this eighth embodiment, lip parts 42a, 42b are provided along the ends of the lower surface of the copper plate 34 of the upper high thermal conductivity insulating substrate 32. Also, grooves 43a, 43b are provided along both ends of the upper surface of the copper plate 38 of the lower high thermal conductivity insulating substrate 36. When the two high thermal conductivity insulating substrates 32, 36 are brought face to face, the tops of the lip parts 42a, 42b are fitted into and bonded to the grooves 43a, 43b (see FIG. 29). Thus in this eighth embodiment, the two high thermal conductivity insulating substrates 32, 36 can be correctly positioned with respect to each other by mating and bonding of the lip parts 42a, 42b and the grooves 43a, 43b.

Ninth Embodiment

FIG. 30 and FIG. 31 show a ninth embodiment of the present invention, and differences between this ninth embodiment and the first embodiment will now be described. In this ninth embodiment, when the two high thermal conductivity insulating substrates 2, 3 are brought face to face and bonded together, an electrode pattern on the high thermal conductivity insulating substrate 2 and an electrode pattern on the high thermal conductivity insulating substrate 3 are bonded together.

Specifically, as shown in FIG. 30, a projecting part 46 is provided on a part of an electrode pattern 44 on the high thermal conductivity insulating substrate 2 that is not to be bonded to a semiconductor chip 45, and this projecting part 46 is bonded by for example soldering to an electrode pattern 47 on the high thermal conductivity insulating substrate 3. With this construction it is possible, when forming a complex circuit (for example a three-phase invertor main circuit) wherein it is necessary for electrode patterns 44 and 47 of the two high thermal conductivity insulating substrates 2, 3 to be connected, for this to be achieved with electrode patterns 44 and 47 having simple shapes.

The shapes of the electrode patterns 44 and 47 should be determined as necessary, and when as in the first preferred embodiment a plurality of IGBT chips 4 are to be held between the two high thermal conductivity insulating substrates 2, 3 as the semiconductor chip 45, the shapes of the electrode patterns 44 and 47 may be made substantially the same shapes as those of the electrode patterns in the first embodiment.

Tenth Embodiment

FIG. 32 through FIG. 38 show a tenth embodiment of the present invention, and differences between this tenth embodiment and the first embodiment will now be described. In this tenth embodiment, two high thermal conductivity insulating substrates 48, 49 are made up of insulating members 50, 51 and electrodes 52, 53, 54, 55 and 56 embedded in these insulating members 50, 51. First, the upper high thermal conductivity insulating substrate 48 will be described with reference to FIG.

Figure 37:
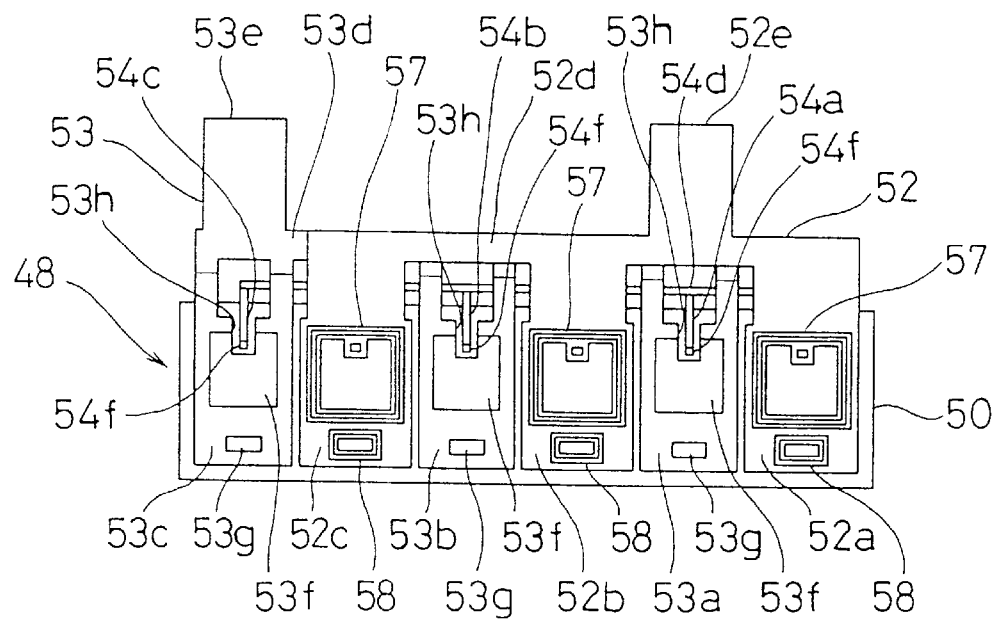
FIG. 37 is a bottom plan view of an upper high thermal conductivity insulating substrate according to the tenth embodiment of the present invention.

This high thermal conductivity insulating substrate 48 is made by embedding three copper electrodes 52, 53, 54 in an insulating member 50 made of a ceramic material such as for example aluminum nitride or alumina. The first electrode 52, as shown also in FIG. 37, is made up of three chip mounting plate parts 52a, 52b, 52c for mounting semiconductor chips, a connecting part 52d for connecting together the upper ends in FIG. 37 of these chip mounting plate parts 52a, 52b, 52c, and an external line connection terminal 52e extending upward in FIG. 37 from this connecting part 52d. IGBT chips 57 and FWD chips 58 are soldered (for example soft soldered) to the three chip mounting plate parts 52a, 52b, 52c. In this case, collector electrodes on the rear surfaces of the IGBT chips 57 are soldered.

The second electrode 53, as shown also in FIG. 37, is made up of three bonding plate parts 53a, 53b and 53c for bonding to electrodes of semiconductor chips mounted on the lower high thermal conductivity insulating substrate 49, a connecting part 53d connecting together the upper ends in FIG. 37 of these bonding plate parts 53a, 53b and 53c, and an external line connection terminal 53e projecting upward in FIG. 37 from this connecting part 53d. On each of the bonding plate parts 53a, 53b and 53c a substantially square bonding part 53f for bonding to the emitter electrode of an IGBT chips 57 and a substantially rectangular bonding part 53g for bonding to the front side electrode of a FWD chips 58 are provided projecting downward slightly (for example about 0.5 mm). A brazing material (for example soft solder) is attached to the lower surface of each of the bonding parts 53f, 53g by printing or plating. A notch 53h is formed in the upper end in FIG. 37 of each of the three bonding plate parts 53a, 53b and 53c.

Figure 32:
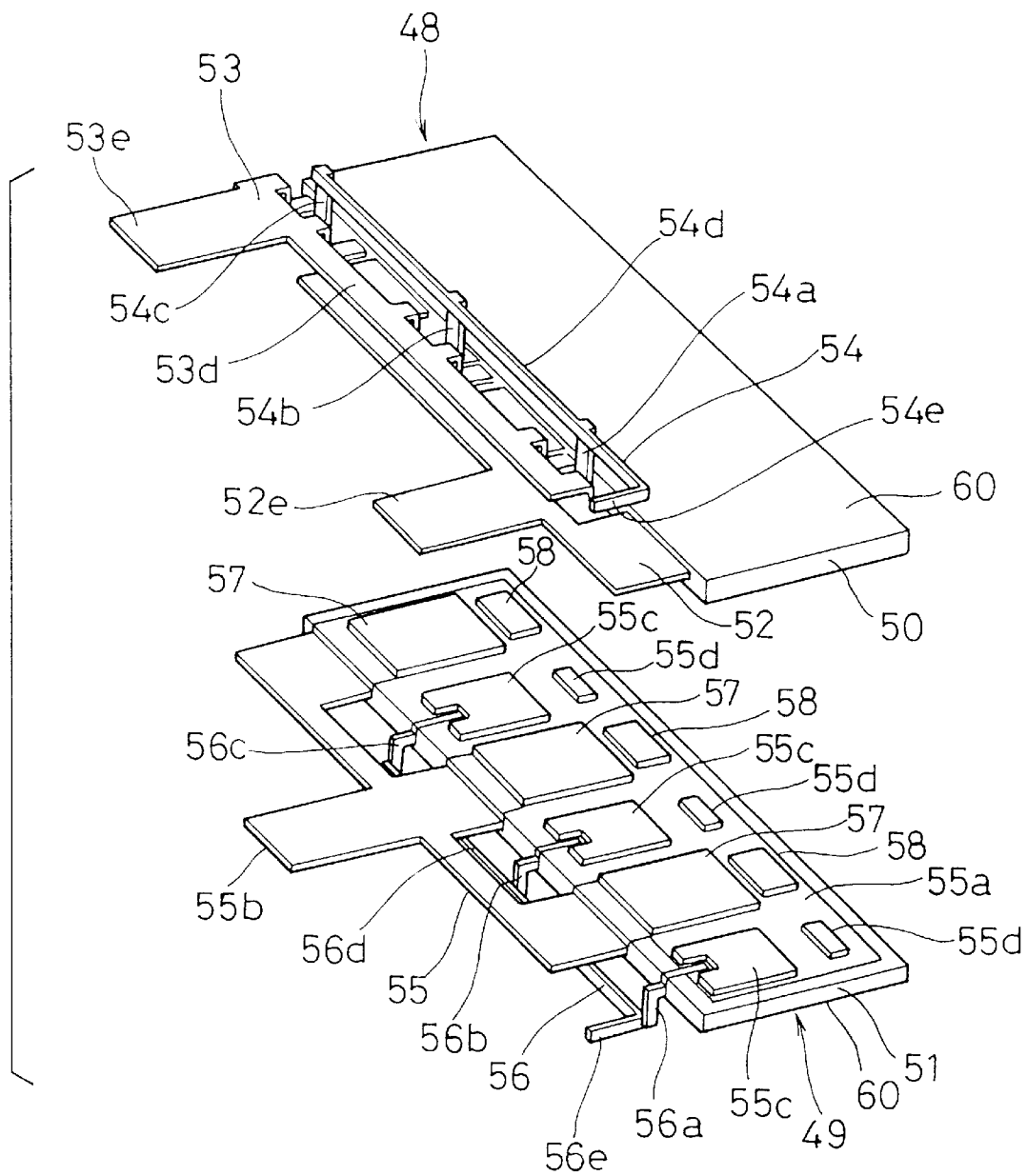
FIG. 32 is an exploded view showing an IGBT module according to a tenth embodiment of the present invention.

The third electrode 54, as shown in FIG. 32 and FIG. 37, is made up of three long and narrow branch plate parts 54a, 54b and 54c extending into the three notches 53h of the second electrode 53, a connecting part 54d connecting together the upper ends in FIG. 37 of these branch plate parts 54a, 54b and 54c, and an external line connection terminal 54e provided projecting to the left from the right hand end in FIG. 32 of this connecting part 54d. Bonding parts 54f for bonding to the gate electrodes of the IGBT chips 57 are provided projecting downward slightly (for example about 0.5 mm) on the end portions of the branch plate parts 54a, 54b and 54c.

Metal bumps made of solder or gold are formed on the bottom surfaces of the bonding parts 54f.

In the manufacture of the high thermal conductivity insulating substrate 48 described above, the insulating member 50 is sintered and molded with slots for embedding the three electrodes 52, 53, 54 preformed in it. The three electrodes 52, 53, 54 are then located in this insulating member 50, and a brazing material is soaked into the gaps and hardened. In this case, as the brazing material, a higher melting point brazing material (hard solder) than the brazing material to be used for bonding the semiconductor chips is used. When the operation of embedding the three electrodes 52, 53, 54 in the insulating member 50 is finished, an insulating film 60 made of for example aluminum nitride is formed on the upper surface in FIG. 34 of the high thermal conductivity insulating substrate 48 (the electrodes 52, 53, 54). Then, after the insulating film 60 is formed, the IGBT chips 57 and the FWD chips 58 are brazed to the first electrode 52.

Figure 38:
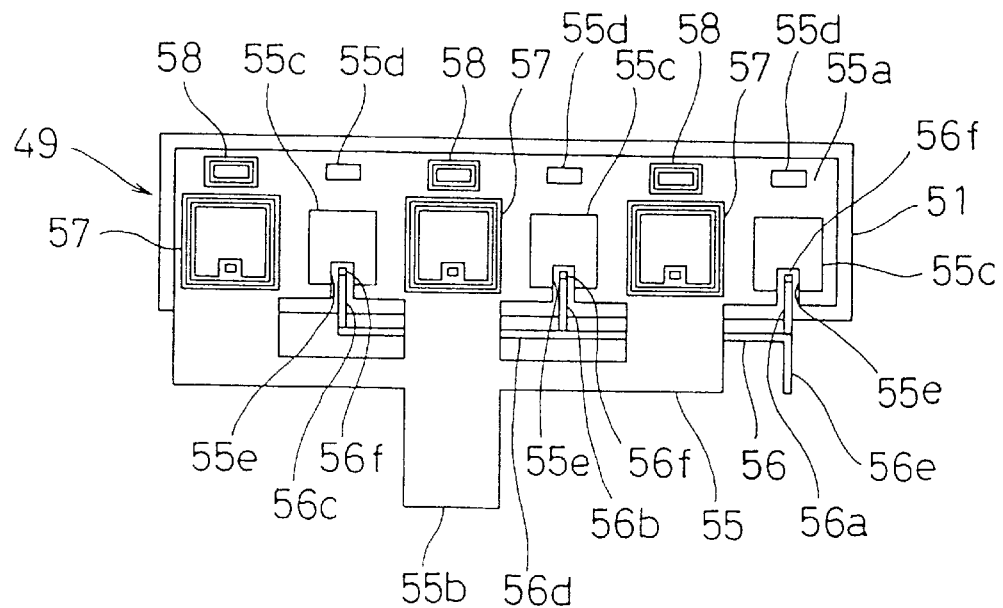
FIG. 38 is a top plan view of a lower high thermal conductivity insulating substrate according to the tenth embodiment of the present invention.

The low high thermal conductivity insulating substrate 49 is made by embedding two copper electrodes 55, 56 in an insulating member 51 made of a ceramic material such as for example aluminum nitride or alumina. The first electrode 55, as shown in FIG. 38, is made up of a base part 55a and an external line connection terminal 55b projecting downward in FIG. 38 from the lower end of this base part 55a. Three IGBT chips 57 and three FWD chips 58 are brazed to the base part 55a so as to face the three bonding parts 53f and the three bonding parts 53g of the second electrode 53 of the upper high thermal conductivity insulating substrate 48. In this case, the collector electrodes on the rear sides of the IGBT chips 57 are brazed.

Also, three substantially square bonding parts 55c and three substantially rectangular bonding parts 55d are provided projecting downward slightly (for example 0.5 mm) on the base part 55a so as to face the three IGBT chips 57 and the three FWD chips 58 brazed to the first electrode 52 of the upper high thermal conductivity insulating substrate 48. A brazing material (for example soft solder) is attached to the upper surfaces of the bonding parts 55c, 55d by printing or plating (see FIG. 34). Also, a notch 55e is formed in the lower end in FIG. 38 of each of the three bonding parts 55c of the base part 55a.

The second electrode 56, as shown in FIG. 32 and FIG. 38, is made up of three long and narrow branch plate parts 56a, 56b and 56c severally extending into the three notches 55e in the first electrode 55, a connecting part 56d connecting together the lower ends in FIG. 38 of these branch plate parts 56a, 56b and 56c, and an external line connection terminal 56e provided projecting to the left from the right hand end in FIG. 32 of this connecting part 56d. Bonding parts 56f for bonding to the gate electrodes of the IGBT chips 57 are provided on end portions of the branch plate parts 56a, 56b and 56c so that they project slightly (for example 0.5 mm) upward (see FIG. 38). Metal bumps consisting of solder or gold are formed on the upper surfaces of the bonding parts 56f.

The high thermal conductivity insulating substrate 49 is manufactured in the same way as the upper high thermal conductivity insulating substrate 48. When the operation of embedding the two electrodes 55, 56 in the insulating member 51 is finished, an insulating film 61 made of for example aluminum nitride is formed on the lower surface in FIG. 34 of the high thermal conductivity insulating substrate 49 (the electrodes 52, 53, 54). Then, after the formation of the insulating film 61, the IGBT chips 57 and the FWD chips 58 are brazed to the first electrode 55.

Figure 34:
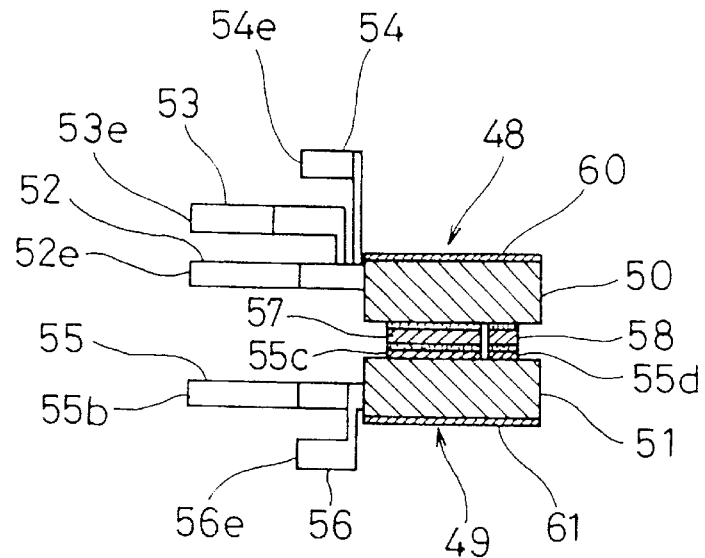
FIG. 34 is an enlarged longitudinal partially sectional view showing manufacturing processes of the IGBT module according to the tenth embodiment of the present invention.

Next, the two high thermal conductivity insulating substrates 48, 49 thus made are brought face to face as shown in FIG. 34 and the six IGBT chips 57 and the six FWD chips 58 are sandwiched between the two high thermal conductivity insulating substrates 48, 49. As a result, the bonding parts 53f and 53g of the second electrode 53 of the upper high thermal conductivity insulating substrate 48 and the emitter electrodes of the IGBT chips 57 and the front side electrodes of the FWD chips 58 on the lower high thermal conductivity insulating substrate 49 side come together with brazing material therebetween and the bonding parts 54f of the third electrode 54 on the upper high thermal conductivity insulating substrate 48 come into contact with the gate electrodes of the IGBT chips 57 on the lower high thermal conductivity insulating substrate 49 side.

Along with this, the bonding parts 55c and 55d of the first electrode 55 on the lower high thermal conductivity insulating substrate 49 and the emitter electrodes of the IGBT chips 57 and the front side electrodes of the FWD chips 58 on the upper high thermal conductivity insulating substrate 48 side come together with brazing material therebetween and the bonding parts 56f of the second electrode 56 of the lower high thermal conductivity insulating substrate 49 and the gate electrodes of the IGBT chips 57 on the upper high thermal conductivity insulating substrate 48 side come into contact.

Figure 35:
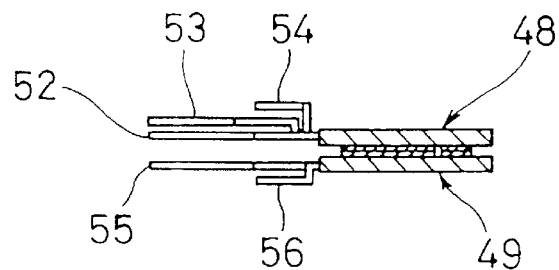
FIG. 35 is a longitudinal partially sectional view showing the IGBT module according to the tenth embodiment of the present invention.
Figure 36:
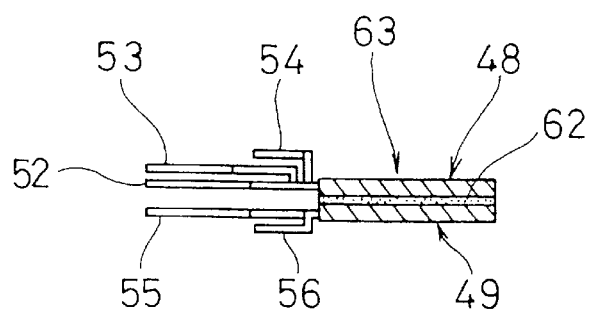
FIG. 36 is a longitudinal partially sectional view showing the IGBT module filled with an insulating resin according to the tenth embodiment of the present invention.

Then, reflow soldering is carried out by the above-mentioned bonding parts being heated with a hot plate or in a heating oven. As a result, the bonding parts are brazed (specifically, soft soldered) and the state shown in FIG. 33 and FIG. 35 is obtained. The bonding between the gate electrodes of the IGBT chips 57 and the bonding parts 54f of the third electrode 53 and the bonding between the gate electrodes of the IGBT chips 57 and the bonding parts 56f of the second electrode 56 is effected by way of the metal bumps.

FIG. 34 is considerably enlarged in the thickness direction (the vertical direction in FIG. 34); FIG. 35 shows these thickness direction dimensions approximately matched to actual dimensions. After the above-mentioned brazing is carried out, an insulating resin 62 consisting of for example epoxy resin or silicone resin or the like is filled between the two high thermal conductivity insulating substrates 48, 49 and hardened. In this way an IGBT module 63 is completed. When mounting coolers to this IGBT module 63 it is possible to mount a cooler to each of the upper surface and to the lower surface of the high thermal conductivity insulating substrates 48 and 49, that is, to the upper surface of the insulating film and to the lower surface of the insulating film 61 respectively.

With this tenth embodiment, heat produced by the IGBT chips 57 is swiftly radiated through the electrodes 52, 53 and 55 brazed to the upper and lower principal surfaces of the IGBT chips 57, and the same effects as those of the first preferred embodiment can be obtained.

Although in this tenth embodiment the electrodes 52, 53, 54, 55 and 56 are made of copper this is not because of any limitation, and instead of this they may for example be made of a metal including Mo(molybdenum) or W(Tungsten). When this kind of metal electrode is used, the thermal expansion coefficient matching between the electrodes and the insulating members 50 and 51 improves.

Although the present invention has been described in connection with the preferred embodiments thereof with reference to the accompanying drawings, it is to be noted that various changes and modifications will be apparent to those skilled in the art. Such changes and modifications are to be understood as being included within the scope of the present invention as defined in the appended claims.

What is claimed is:

1. A semiconductor device comprising:
   a semiconductor chip having a first principle surface and a second principle surface, said first principle surface having a first main electrode, said second principle surface having a second main electrode and a control electrode;
   a first high thermal conductivity insulating substrate having a first electrode pattern connected to said first main electrode with a brazing material; and
   a second high thermal conductivity insulating substrate having a second electrode pattern connected to said second main electrode and said control electrode with said brazing material, wherein;
   said semiconductor chip is sandwiched by said first high thermal conductivity insulating substrate and said second high thermal conductivity insulating substrate; and
   said first electrode pattern includes a first terminal which is extended outwardly and parallel to said first high thermal conductivity insulating substrate and a second terminal which is extended outwardly and parallel to said second high thermal conductivity insulating substrate.

2. A semiconductor device according to claim 1, wherein said first terminal and said second terminal are extended in opposite directions.

3. A semiconductor device according to claim 1, wherein said high thermal conductivity insulating substrates are made of aluminum nitride.

4. A semiconductor device according to claim 1, wherein each of sad high thermal conductivity insulating substrates includes a lamination of a high thermal conductivity member and an insulating member.

5. A semiconductor device according to claim 4, wherein said high thermal conductivity member includes one of a copper, a silicon carbide ceramic, a material made by impregnating silicon carbide with a metal, and a composite material formed by casting a metal which includes a silicon carbide.

6. A semiconductor device according to claim 1, wherein at least one of said first and second high thermal conductivity insulating substrates includes a protrusion bonded to an opposite high thermal conductivity insulating substrate.

7. A semiconductor device according to claim 6, wherein said opposite high thermal conductivity insulating substrate includes a groove which is matched and bonded to said protrusion.

8. A semiconductor device according to claim 6, wherein said brazing material comprises an electrically conducting material which melts at a temperature under an operation of said semiconductor chip.

9. A semiconductor device according to claim 8, wherein said electrically conducting material comprises one of an indium, a gallium and a solder.

10. A semiconductor device according to claim 1, wherein said second main electrode and said second electrode pattern are bonded via a plurality of metal bumps concentrically formed on said second main electrode.

11. A semiconductor device according to claim 10, wherein said metal bumps include one of gold and solder.

12. A semiconductor device comprising:
   a semiconductor chip having a first principle surface and a second principle surface, said first principle surface having a first main electrode, said second principle surface having a second main electrode and a control electrode;
   a first high thermal conductivity insulating substrate having a first electrode pattern connected to said first main electrode with a brazing material; and
   a second high thermal conductivity insulating substrate having a second electrode pattern connected to said second main electrode and said control electrode with said brazing material, wherein;
   said semiconductor chip is sandwiched by said first high thermal conductivity insulating substrate and said second high thermal conductivity insulating substrate;
   said first and second electrode patterns have a protruding portion at a place corresponding to said electrodes of said semiconductor chip;
   a height of said protruding portion is greater than other portion, corresponding to other than said electrodes, of said electrode patterns; and
   a bonding area of said protruding portion is equal to or smaller than an opposing area of said electrodes.

13. A semiconductor device according to claim 1, wherein;
   one of said first and second electrode patterns has a protruding portion at a place corresponding to other than said electrodes of said semiconductor chip; and
   said protruding portion is connected to another electrode pattern.

14. A semiconductor device according to claim 1, wherein said first and second high thermal conductivity insulating substrates have an insulating resin filled therebetween.

15. A semiconductor device comprising:
   a first and a second semiconductor chips, each of said semiconductor chips having a first principle surface and a second principle surface, said first principle surface having a first main electrode, said second principle surface having a second main electrode and a control electrode;
   a first high thermal conductivity insulating substrate having a first electrode pattern connected to said first main electrode of said first semiconductor chip and said second main electrode and said control electrode of said second semiconductor chip with a brazing material; and
   a second high thermal conductivity insulating substrate having a second electrode pattern connected to said second main electrode and said control electrode of said first semiconductor chip and said first main electrode of said second semiconductor chip with said brazing material, wherein;
   said first and second semiconductor chips are sandwiched by said first high thermal conductivity insulating substrate and said second high thermal conductivity insulating substrate.

16. A semiconductor device according to claim 15, wherein said first electrode pattern includes a first terminal which is extended outwardly and parallel to said first high thermal conductivity insulating substrate and a second terminal which is extended outwardly and parallel to said second high thermal conductivity insulating substrate.

17. A semiconductor device according to claim 16, wherein said first terminal and said second terminal are extended in opposite directions.

18. A semiconductor device according to claim 15, wherein said high thermal conductivity insulating substrates are made of aluminum nitride.

19. A semiconductor device according to claim 15, wherein each of said high thermal conductivity insulating substrates includes a lamination of a high thermal conductivity member and an insulating member.

20. A semiconductor device according to claim 19, wherein said high thermal conductivity member includes one of a copper, a silicon carbide ceramic, a material made by impregnating silicon carbide with a metal, and a composite material formed by casting a metal which includes a silicon carbide.

21. A semiconductor device according to claim 15, wherein at least one of said first and second high thermal conductivity insulating substrates includes a protrusion bonded to an opposite high thermal conductivity insulating substrate.

22. A semiconductor device according to claim 21, wherein said opposite high thermal conductivity insulating substrate includes a groove which is matched and bonded to said protrusion.

23. A semiconductor device according to claim 21, wherein said brazing material comprises an electrically conducting material which melts at a temperature under an operation of said semiconductor chip.

24. A semiconductor device according to claim 23, wherein said electrically conducting material comprises one of an indium, a gallium and a solder.

25. A semiconductor device according to claim 15, wherein said second main electrode of said first semiconductor chip and said second electrode pattern, and said second main electrode of said second semiconductor chip and said first electrode pattern, are bonded via a plurality of metal bumps concentrically formed on said second main electrodes.

26. A semiconductor device according to claim 25, wherein said metal bumps include one of gold and solder.

27. A semiconductor device comprising:
   a first and a second semiconductor chips, each of said semiconductor chips haling a first principle surface and a second principle surface, said first principle surface having a first main electrode, said second principle surface having a second main electrode and a control electrode;

a first high thermal conductivity insulating substrate having a first electrode pattern connected to said first main electrode of said first semiconductor chip and said second main electrode and said control electrode of said second semiconductor chip with a brazing material; and a second high thermal conductivity insulating substrate having a second electrode pattern connected to said second main electrode and said control electrode of said first semiconductor chip and said first main electrode of said second semiconductor chip with said brazing material, wherein;

said first and second semiconductor chips are sandwiched by said first high thermal conductivity insulating substrate and said second high thermal conductivity insulating substrate;

said first and second electrode patterns have a protruding portion at a place corresponding to said electrodes of said semiconductor chips;

a height of said protruding portion is greater than other portion, corresponding to other than said electrodes, of said electrode patterns; and a bonding area of said protruding portion is equal to or smaller than an opposing area of said electrodes.

28. A semiconductor device according to claim 15, wherein;

one of said first and second electrode patterns has a protruding portion at a place corresponding to other than said electrodes of said semiconductor chip; and said protruding portion is connected to another electrode pattern.

29. A semiconductor device according to claim 15, wherein said first and second high thermal conductivity insulating substrates have an insulating resin filled therebetween.

* * * * *